(12) United States Patent
Han et al.

(10) Patent No.: US 9,653,336 B2
(45) Date of Patent: May 16, 2017

(54) SEMICONDUCTOR DEVICE AND MANUFACTURING METHOD THEREOF

(71) Applicant: Amkor Technology, Inc., Tempe, AZ (US)

(72) Inventors: Yi Seul Han, Incheon (KR); Jae Beum Shim, Incheon (KR); Byong Jin Kim, Bucheon-si (KR); In Bae Park, Seoul (KR)

(73) Assignee: Amkor Technology, Inc.

( * ) Notice: Subject to any disclaimer, the term of this patent is extended or adjusted under 35 U.S.C. 154(b) by 0 days.

(21) Appl. No.: 15/073,219

(22) Filed: Mar. 17, 2016

(65) Prior Publication Data
US 2016/0276178 A1    Sep. 22, 2016

(30) Foreign Application Priority Data

Mar. 18, 2015  (KR) .......................... 10-2015-0037381

(51) Int. Cl.
| | |
|---|---|
| *H01L 21/44* | (2006.01) |
| *H01L 21/683* | (2006.01) |
| *H01L 21/768* | (2006.01) |
| *H01L 23/00* | (2006.01) |
| *H01L 21/288* | (2006.01) |
| *H01L 23/31* | (2006.01) |

(52) U.S. Cl.
CPC ...... *H01L 21/6836* (2013.01); *H01L 21/2885* (2013.01); *H01L 21/76885* (2013.01); *H01L 23/3114* (2013.01); *H01L 24/11* (2013.01); *H01L 2224/13025* (2013.01); *H01L 2924/01029* (2013.01)

(58) Field of Classification Search
CPC ..... H01L 21/56; H01L 21/683; H01L 21/288; H01L 21/768; H01L 23/00
See application file for complete search history.

(56) References Cited

U.S. PATENT DOCUMENTS

2013/0249082 A1*  9/2013  Chien ................. H01L 23/3192
                                                257/737
2013/0299967 A1*  11/2013  Daniels .................. H01L 24/03
                                                257/737

FOREIGN PATENT DOCUMENTS

JP       1079362        3/1998
KR     20070117986    12/2007

OTHER PUBLICATIONS

Office Action dated Feb. 21, 2016 corresponding to Korean Patent Application No. 10-2015-0037381.

* cited by examiner

*Primary Examiner* — Charles Garber
*Assistant Examiner* — Abdulfattah Mustapha
(74) *Attorney, Agent, or Firm* — McAndrews, Held & Malloy, Ltd.

(57) ABSTRACT

An electronic device and a method of making an electronic device. As non-limiting examples, various aspects of this disclosure provide various methods of making electronic devices, and electronic devices made thereby, that utilize a film assist mold process.

20 Claims, 13 Drawing Sheets

SEMICONDUCTOR DEVICE AND MANUFACTURING METHOD THEREOF

CROSS-REFERENCE TO RELATED APPLICATIONS/INCORPORATION BY REFERENCE

The present application makes reference to, claims priority to, and claims the benefit of Korean Patent Application No. 10-2015-0037381 filed on Mar. 18, 2015, in the Korean Intellectual Property Office and titled "SEMICONDUCTOR DEVICE AND MANUFACTURING METHOD THEREOF," the contents of which are hereby incorporated herein by reference in their entirety.

BACKGROUND

Present semiconductor packages and methods for forming semiconductor packages are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
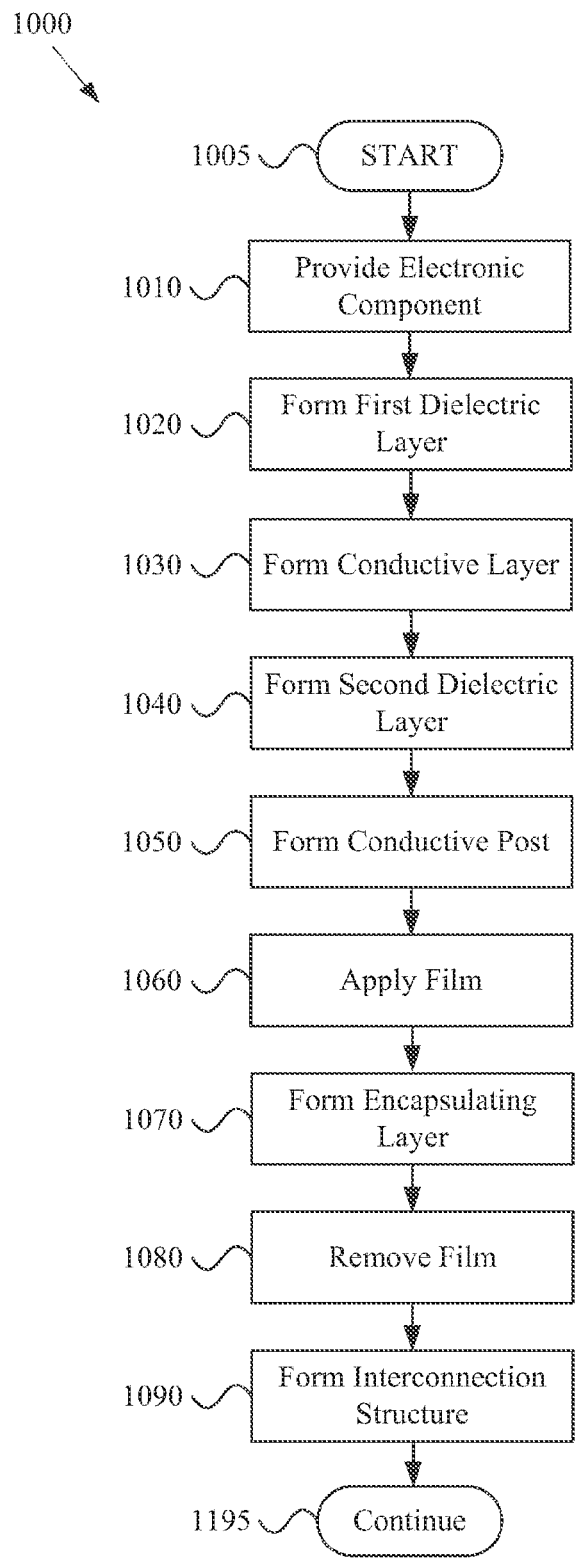
FIG. 1 shows a flow diagram of an example method of making an electronic device, in accordance with various aspects of the present disclosure.

Various aspects of this disclosure provide an electronic device and a method of making an electronic device. As non-limiting examples, various aspects of this disclosure provide various methods of making electronic devices, and electronic devices made thereby, that utilize a film assist mold process.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

Various aspects of the present disclosure provide an electronic device and a method of manufacturing thereof with the improved device reliability and improved manufacturing process reliability, for example providing a fine pitch implementation that includes a metal post and by utilizing a film assist mold process for forming an encapsulant.

Various aspects of the present disclosure provide an electronic device that includes a semiconductor die including a bond pad (or plurality thereof), a copper post electrically connected to the bond pad, an encapsulant on an upper part of the semiconductor die that exposes the copper post, and a conductive ball that surrounds an upper part of the copper post.

Various aspects of the present disclosure provide a method of manufacturing an electronic device that includes: preparing a semiconductor die including a bond pad (or plurality thereof); forming a copper post electrically connected to the bond pad; stacking and pressurizing a film at an upper part of the copper post; forming an encapsulating material in a cavity between the semiconductor die and the film; and forming a conductive ball that surrounds the upper part of the copper post.

The above and other aspects of the present disclosure will be described in or be apparent from the following description of various example implementations. Various aspects of the present disclosure will now be presented with reference to accompanying drawings. Note that like numbers are generally used herein to denote like elements in the drawings.

FIG. 1 shows a flow diagram of an example method 1000 of making an electronic device, in accordance with various aspects of the present disclosure. The example method 1000 may, for example, share any or all characteristics with any other method discussed herein (e.g., the example method 3000 of FIG. 3, the example method 5000 of FIG. 5, etc.). FIGS. 2A-2J show cross-sectional views illustrating example electronic devices and example methods of making an electronic device, in accordance with various aspects of the present disclosure. The structures shown in 2A-2J may share any or all characteristics with analogous structures shown in FIGS. 4A-4D, FIGS. 6A-6E, etc. FIGS. 2A-2J may, for example, illustrate an example electronic device at various stages (or blocks) of the example method 1000 of FIG. 1. FIGS. 1 and 2A-2J will now be discussed together. It should be noted that the order of the example blocks of the example method 1000 may vary, various blocks may be omitted, and/or various blocks may be added without departing from the scope of this disclosure.

The example method 1000 may, at block 1010, comprise providing an electronic component for processing. Block 1010 may comprise providing the electronic component in any of a variety of manners, non-limiting examples of which are provided herein.

The electronic component may comprise any of a variety of characteristics. For example, the electronic component may comprise an active component (e.g., a semiconductor transistor, semiconductor integrated circuit, various diodes, optoelectronic devices, power sources, etc.), a passive component (e.g., a resistor, capacitor, inductor, various sensors or transducers, etc.), electromechanical components, combinations thereof, equivalents thereof, etc. In various example implementations, the electronic component may also comprise an interposer or substrate, and/or an interposer or substrate with only signal routing and connecting structures (e.g., with no active or passive components).

The electronic component may, for example, comprise a semiconductor die. The semiconductor die may, for example, be or comprise silicon or other semiconductor material with one or more circuit elements formed therein. For example, the semiconductor die may comprise logic circuitry (e.g., discrete logic circuitry, processor circuitry, application specific integrated circuitry, programmable logic circuitry, etc.), memory circuitry (e.g., random access memory, read only memory, EEPROM circuitry, flash memory circuitry, memory stick memory, etc.), analog circuitry, digital and/or analog power supply circuitry, hybrid analog/digital circuitry, etc.

Though the examples presented herein mainly concern a single semiconductor die, the scope of this disclosure is not limited to a single component. For example, the semiconductor die may (e.g., throughout any or all of the process blocks discussed herein) be in a wafer or panel form. Such a wafer or panel may comprise same components or different components.

Additionally, though the examples presented herein mainly concern a single connection or terminal of an electronic component, the scope of the present disclosure is not limited thereto. For example, the aspects discussed herein readily extend to any number of connections or terminals of an electronic component (or a plurality thereof).

Block 1010 may, for example, comprise receiving the semiconductor die (or wafer thereof) from an upstream manufacturing station or process (e.g., cleaning process, marking or tracking process, etc.), receiving the semiconductor die (or wafer thereof) from an offsite location (e.g., an offsite semiconductor fabrication facility, warehouse, etc.), etc. Block 1010 may then, for example, comprise providing such received semiconductor die for further processing.

The semiconductor die provided at block 1010 may, for example, comprise a conductive pad (e.g., bond pad, land, trace, etc.). The semiconductor die may also comprise a die dielectric layer, which may for example comprise an aperture (or opening) extending through the die dielectric layer that exposes the conductive pad through the die dielectric layer.

Note that block 1010 may comprise receiving the semiconductor die already configured with the conductive pad and die dielectric layer, or may comprise forming the conductive pad and/or die dielectric layer.

The conductive pad may comprise any of a variety of materials (e.g., copper, aluminum, nickel, iron, silver, gold, titanium, chromium, tungsten, combinations thereof, alloys thereof, equivalents thereof, etc.), but the scope of the present disclosure is not limited thereto. The conductive pad may be formed or deposited utilizing any one or more of a variety of processes (e.g., electrolytic plating, electroless plating, chemical vapor deposition (CVD), sputtering or physical vapor deposition (PVD), plasma vapor deposition, printing, etc.), but the scope of the present disclosure is not limited thereto. The conductive pad may, for example, be utilized for inputting and/or outputting electrical signals to and/or from the semiconductor die (or other component).

The die dielectric layer may comprise one or more layers of any of a variety of dielectric materials, for example inorganic dielectric material (e.g., $Si_3N_4$, $SiO_2$, SiON, SiN, oxides, nitrides, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, equivalents thereof, etc.), but the scope of the present disclosure is not limited thereto.

The die dielectric layer may be formed using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, etc.), but the scope of the present disclosure is not limited thereto. Note that the die dielectric layer may be or comprise a native dielectric material (e.g., a native oxide layer, etc.).

Figure 2A:
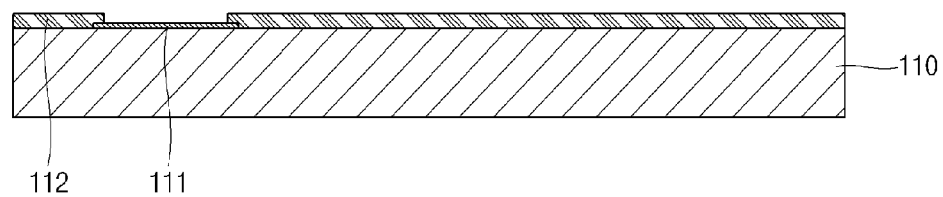
FIGS. 2A-2J show cross-sectional views illustrating example electronic devices and example methods of making an electronic device, in accordance with various aspects of the present disclosure.

An example implementation 200A showing various aspects of block 1010 is shown at FIG. 2A. The example implementation 200A (or assembly, sub-assembly, package, etc.) comprises a semiconductor die 110, a conductive pad 111, and a die dielectric layer 112. Note that although only a single conductive pad 111 is shown, it should be understood that a plurality of such conductive pads 111 and/or respective apertures in the die dielectric layer 112 may be present, for example for a single semiconductor die and/or for a plurality of semiconductor die in wafer or panel form.

In general, block 1010 may comprise providing an electronic component for processing. Accordingly, the scope of this disclosure should not be limited by characteristics of any particular type of component or any particular manner of providing and/or preparing such a component.

The example method 1000 may, at block 1020, comprise forming a first dielectric layer. Block 1020 may comprise forming the first dielectric layer in any of a variety of manners, non-limiting examples of which are provided herein. The first dielectric layer may also be referred to as a passivation layer.

Block 1020 may, for example, comprise forming the first dielectric layer on the semiconductor die. For example, block 1020 may comprise forming the first dielectric layer on (e.g., directly or indirectly on) the die dielectric layer and/or on at least a portion of the conductive pad exposed through the aperture in the die dielectric layer. The first dielectric layer may also, for example, comprise a first aperture (or opening) through which the conductive pad is exposed. In an example implementation, the entire die dielectric layer (e.g., a top surface or top side thereof, etc.) may be covered by the first dielectric layer, a outward ring of the conductive pad may be covered by the first dielectric layer, an outermost peripheral ring of the conductive pad may be covered by the die dielectric layer and the first dielectric layer (e.g., on top of the die dielectric layer), and a center region of the conductive pad may be exposed through the aperture in the die dielectric layer and through the first aperture in the first dielectric layer.

The first dielectric layer may comprise one or more layers of any of a variety of dielectric materials, for example inorganic dielectric material (e.g., $Si_3N_4$, $SiO_2$, SiON, SiN, oxides, nitrides, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, etc.), but the scope of the present disclosure is not limited thereto.

The first dielectric layer may, for example, comprise a different dielectric material (or type of dielectric material) than the die dielectric layer. For example, in a first example implementation, the first dielectric layer may comprise an organic dielectric material, and the die dielectric layer may comprise an inorganic dielectric material. In another example implementation, the first dielectric layer may comprise the same dielectric material as the die dielectric layer.

Block 1020 may comprise forming the first dielectric layer using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, etc.), but the scope of the present disclosure is not limited thereto. As discussed herein, block 1020 (or generally any or all of the processes discussed herein) may be performed at the semiconductor wafer level or panel level, or at the individual die level.

Figure 2B:
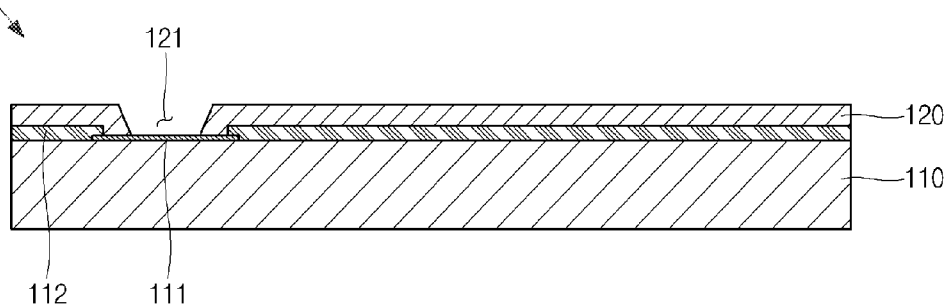

An example implementation 200B showing various aspects of block 1020 is shown at FIG. 2B. The example implementation 200B (or assembly, sub-assembly, package, etc.) comprises a first dielectric layer 120 formed on (e.g., directly on) the die dielectric layer 112 and on (e.g., directly on) an outward ring of the conductive pad 111 exposed through the die dielectric layer 112 by an aperture therein. The first dielectric layer 120 comprises a first aperture (or opening) 121 through which a central region of the conductive pad 111 is exposed. A central region of the conductive pad 111 is exposed through the aperture in the die dielectric layer 112 and through the first aperture 121 in the first dielectric layer 120, an outward ring of the conductive pad 111 is exposed through the aperture in the die dielectric layer 112 but is covered by the first dielectric layer 120, and an outermost peripheral ring of the conductive pad 111 is covered by both the die dielectric layer 112 and the first dielectric layer 120. Note that the so-called example rings need not be circular. For example, the outward ring and outermost peripheral ring may be square-shaped, rectangular-shaped, oval or elliptical-shaped, polygon-shaped, etc.

In general, block 1020 may comprise forming a first dielectric layer. Accordingly, the scope of this disclosure should not be limited by characteristics of any particular type of dielectric layer or by any particular manner of forming a dielectric layer.

The example method 1000 may, at block 1030, comprise forming a conductive layer. Block 1030 may comprise forming the conductive layer in any of a variety of manners, non-limiting examples of which are provided herein. The conductive layer may also be referred to as a redistribution layer, a signal distribution structure, signal routing layer, etc.

Block 1030 may, for example, comprise forming the conductive layer on (e.g., directly on or indirectly on) the central region of the conductive pad that is exposed by the aperture in the die dielectric layer and by the first aperture in the first dielectric layer. The conductive layer is thus electrically and mechanically coupled to the conductive pad.

The conductive layer may, for example, be formed directly on the conductive pad (e.g., with or without a seed layer) or the conductive layer may be formed on intervening metallic layers formed on the conductive pad before the conductive layer. The conductive layer may, for example, comprise a first portion formed in the first aperture in the first dielectric layer, and a second portion formed on the top surface of the first dielectric layer.

The conductive layer may comprise any of a variety of materials (e.g., copper, aluminum, nickel, iron, silver, gold, titanium, chromium, tungsten, combinations thereof, alloys thereof, etc.), but the scope of the present disclosure is not limited thereto. The conductive layer may, for example, comprise the conductive material as the conductive pad. In an example implementation, the conductive layer and the conductive pad may both comprise copper and/or may be directly bonded to each other.

Block 1030 may comprise forming (or depositing) the conductive layer utilizing any one or more of a variety of processes (e.g., electrolytic plating, electroless plating, chemical vapor deposition (CVD), sputtering or physical vapor deposition (PVD), plasma vapor deposition, printing, etc.), but the scope of the present disclosure is not limited thereto. In an example implementation, a seed layer may be formed on the conductive pad and/or on the first dielectric layer (e.g., deposited, sputtered, etc.), a mask may be formed on the seed layer and patterned to cover areas of the seed layer that are not to be plated, the conductive layer (or portion thereof) may then be electroplated on the seed layer, and the mask and non-plated portions of the seed layer may be removed (e.g., dissolved, etched, etc.). In another example implementation, the conductive layer may be formed without a seed layer (e.g., utilizing electroless plating, etc.). As discussed herein, block 1030 (or generally any or all of the processes discussed herein) may be performed at the semiconductor wafer level or panel level, or at the individual die level.

Figure 2C:
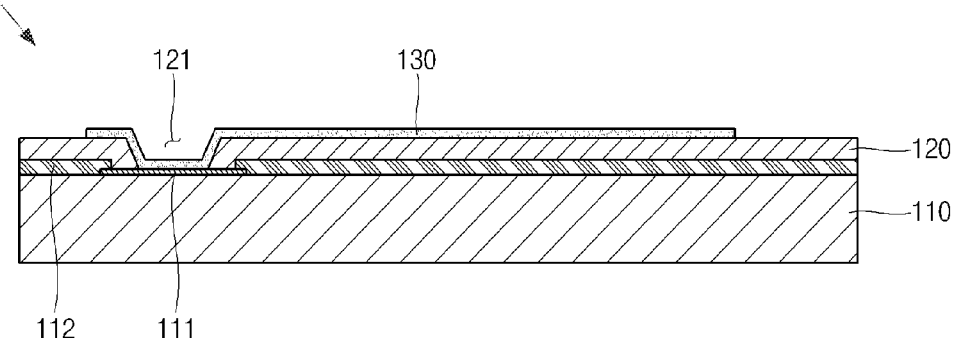

An example implementation 200C showing various aspects of block 1030 is shown at FIG. 2C. The example implementation 200C (or assembly, sub-assembly, package, etc.) comprises a conductive layer 130 formed on (e.g., directly on) the first dielectric layer 120 and on a central region of the conductive pad 111 exposed through the first aperture in the first dielectric layer 120 and the aperture in the die dielectric layer 112. In the example implementation 200C, the conductive layer 130 does not directly contact the outward ring of the conductive pad 111, which is covered by the first dielectric layer 120, and does not directly contact the outermost peripheral ring of the conductive pad 111, which is covered by both the die dielectric layer 112 and the first dielectric layer 120.

In general, block 1030 may comprise forming a conductive layer. Accordingly, the scope of this disclosure should not be limited by characteristics of any particular type of conductive layer or by any particular manner of forming a conductive layer.

The example method 1000 may, at block 1040, comprise forming a second dielectric layer. Block 1040 may comprise forming the second dielectric layer in any of a variety of manners, non-limiting examples of which are provided herein. Block 1040 may, for example, share any or all characteristics with block 1020, discussed herein. The second dielectric layer may also be referred to as a passivation layer.

Block 1040 may, for example, comprise forming the second dielectric layer on the semiconductor die. For example, block 1040 may comprise forming the second dielectric layer on (e.g., directly or indirectly on) the first dielectric layer (e.g., formed at block 1020) and/or on at least a portion of the conductive layer (e.g., formed at block 1030). The second dielectric layer may also, for example, comprise a second aperture (or opening) through which the conductive layer is exposed. In an example implementation, the first aperture in the first dielectric layer formed at block 1020 may generally correspond to a first end of the conductive layer, and the second aperture in the second dielectric layer may generally correspond to a second end of the conductive layer. Such a configuration may, for example, provide for lateral distribution (or routing) of an electrical signal being transmitted through the conductive layer.

In an example implementation, the entire first dielectric layer (e.g., a top surface or side thereof) may be covered by the second dielectric layer (e.g., completely or partially covered), most of the conductive layer may be covered by the second dielectric layer, and an exposed region of the conductive layer (e.g., corresponding to a conductive pad, ball pad, land, trace, etc.) may be exposed through the second aperture in the second dielectric layer.

The second dielectric layer may comprise one or more layers of any of a variety of dielectric materials, for example inorganic dielectric material (e.g., $Si_3N_4$, $SiO_2$, SiON, SiN, oxides, nitrides, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, etc.), but the scope of the present disclosure is not limited thereto. The second dielectric layer may, for example, be or comprise the same dielectric material as the first dielectric layer and/or the die dielectric layer. The second dielectric layer may also, for example, comprise a dielectric material that is different from the dielectric material(s) of the first dielectric layer and the die dielectric layer.

Block 1040 may comprise forming the second dielectric layer using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, etc.), but the scope of the present disclosure is not limited thereto. As discussed herein, block 1040 (or generally any or all of the processes discussed herein) may be performed at the semiconductor wafer level or panel level, or at the individual die level.

Note that any or all of blocks 1020-1040 may be repeated any number of times, for example to create a multi-layered structure (e.g., a signal distribution structure, etc.) comprising a plurality of conductive layers and/or a plurality of dielectric layers.

Figure 2D:
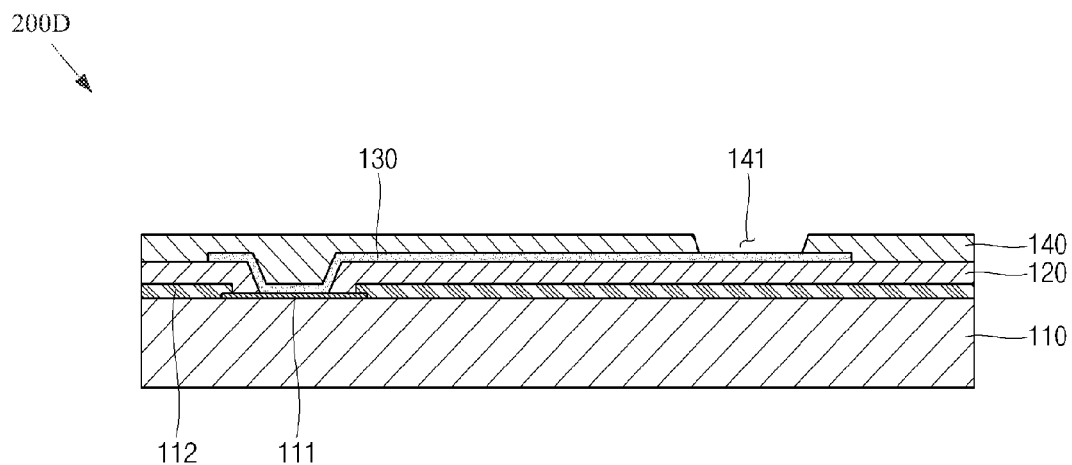

An example implementation 200D showing various aspects of block 1040 is shown at FIG. 2D. The example implementation 200D (or assembly, sub-assembly, package, etc.) comprises a second dielectric layer 140 formed on (e.g., directly on) the first dielectric layer 120 and on (e.g., directly on) most of the conductive layer 130. The second dielectric layer 140 comprises a second aperture (or opening) 141 through which an exposed region of the conductive layer 130 (e.g., corresponding to a conductive pad, ball pad, land, trace, etc.) is exposed.

In general, block 1040 may comprise forming a second dielectric layer. Accordingly, the scope of this disclosure should not be limited by characteristics of any particular type of dielectric layer or by any particular manner of forming a dielectric layer.

The example method 1000 may, at block 1050, comprise forming a conductive post. Block 1050 may comprise forming the conductive post in any of a variety of manners, non-limiting examples of which are provided herein. The conductive post may also be referred to as a conductive pillar, conductive bump, wire, interconnection structure, etc.

Block 1050 may, for example, comprise forming the conductive post on (e.g., directly on or indirectly on) the exposed region of the conductive layer that is exposed by the second aperture in the second dielectric layer. The conductive post is thus electrically and mechanically coupled to the conductive layer. In an example implementation, the conductive pad may be located generally at a first end of the conductive layer, and the conductive post may be located generally at a second end of the conductive layer.

In an example implementation, the conductive post may, for example, have a height that is greater than a width of the conductive post. Also for example, the vertical height (e.g., distance between a top end and a bottom end) of the conductive post may be substantially greater than a vertical thickness of the conductive layer formed at block 1030 (e.g., five to ten times thicker, greater than ten times thicker, greater than twenty times thicker, etc.).

The conductive post may, for example, be formed directly on the conductive layer (e.g., without or without a seed layer) or the conductive post may be formed on intervening metallic layers formed on the conductive pad before the conductive layer (e.g., under bump metallization layers, etc.). The conductive post may, for example, comprise a first portion formed in the second aperture in the second dielectric layer, and a second portion formed above the level of the top surface of the second dielectric layer.

In an example scenario in which an under bump metallization is utilized, the under bump metal (UBM) structure may, for example, be formed between the conductive layer and the conductive post. In an example implementation, the under bump metallization ("UBM") structure, which may also be referred to as an under bump metal structure, may for example comprise a layer of titanium-tungsten (TiW), which may be referred to as a layer or seed layer. Such layer may, for example, be formed by sputtering. Also for example, the UBM structure may comprise a layer of copper (Cu) on the layer of TiW. Such layer may also, for example, be formed by sputtering. In another example implementation forming a UBM structure may comprise forming a layer of titanium (Ti) or titanium-tungsten (TiW) by sputtering, (ii) forming a layer of copper (Cu) on the titanium or titanium-tungsten layer by sputtering, and (iii) forming a layer of nickel (Ni) on the copper layer by electroplating. Note however, that the UBM structure and/or processes utilized to form the UBM structure are not limited to the examples given. For example, the UBM structure may comprise a multilayered structure of chrome/chrome-copper alloy/copper (Cr/Cr-Cu/Cu), titanium-tungsten alloy/copper (Ti—W/Cu), aluminum/nickel/copper (Al/Ni/Cu), equivalents thereof, etc.

The conductive post may comprise any of a variety of materials (e.g., copper, aluminum, nickel, iron, silver, gold, titanium, chromium, tungsten, combinations thereof, alloys thereof, etc.), but the scope of the present disclosure is not limited thereto. The conductive post may, for example, comprise the same conductive material as the conductive layer and/or conductive pad, but such structures may also comprise different respective materials. In an example implementation, the conductive post, conductive layer, and conductive pad may each comprise copper. Note that the conductive post (or other conductive structures discloses herein) may also comprise conductive epoxies, pastes, etc.

Block 1050 may comprise forming (or depositing) the conductive post utilizing any one or more of a variety of processes (e.g., electrolytic plating, electroless plating, chemical vapor deposition (CVD), sputtering or physical vapor deposition (PVD), plasma vapor deposition, printing, etc.), but the scope of the present disclosure is not limited thereto. In an example implementation, a seed layer may be formed (e.g., deposited, sputtered, etc.), a mask may be formed on the seed layer and patterned to cover areas of the seed layer that are not to be plated, the conductive layer may then be electroplated on the seed layer, and the mask and non-plated portions of the seed layer may then be removed (e.g., dissolved, etched, etc.). In another example implementation, the conductive layer may be formed without a seed layer (e.g., utilizing electroless plating, etc.). As discussed herein, block 1050 (or generally any or all of the processes discussed herein) may be performed at the semiconductor wafer level or panel level, or at the individual die (or component) level.

Figure 2E:
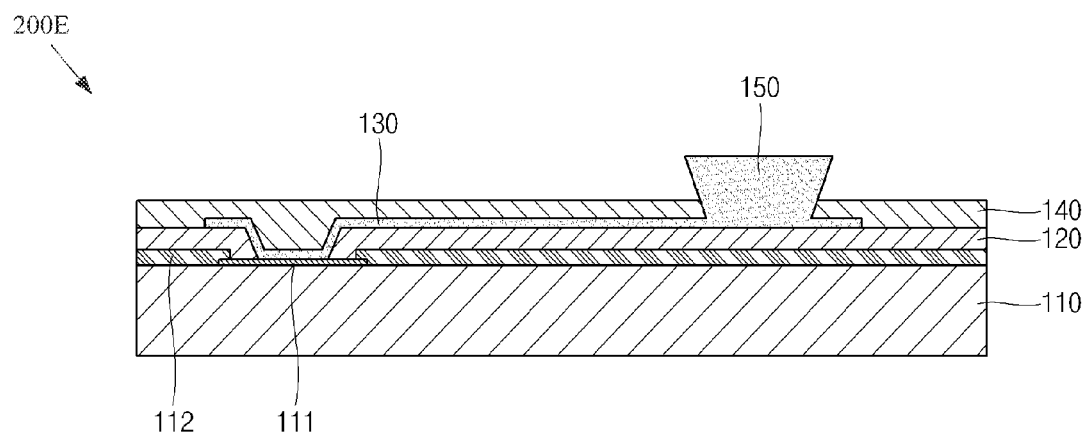

An example implementation 200E showing various aspects of block 1050 is shown at FIG. 2E. The example implementation 200E (or assembly, sub-assembly, package, etc.) comprises a conductive post 150 formed on (e.g., directly on) the exposed portion of the conductive layer 130 exposed by the second aperture 141 in the second dielectric layer 140. The conductive post 150 is thus electrically and mechanically coupled to the conductive layer 130.

In the example implementation 200E, the conductive post 150 comprises a tapered side surface, for example as may be formed in tapered mask apertures in a mask utilized during the post-forming process. The example conductive post 150 is thus wider (e.g., laterally wider) at a top end of the conductive post 150 than at a bottom end of the conductive post 150 (e.g., at the conductive layer 130). In the example implementation 200E, the conductive post 150 is shown with a constant taper from the bottom end to the top end, but such taper need not be constant. There may also, for example, be a sharp corner (or surface discontinuity) at the junction between the top end surface of the conductive post 150 and the lateral side surface. Additionally, in another example implementation, the conductive post 150 may comprise one or more vertical side surfaces extending between the bottom end and the top end surface. Further, the top end surface of the example conductive post 150 is planar and generally parallel to the top and bottom surfaces of the second dielectric layer 140, conductive layer 130, first dielectric layer 120, die dielectric layer 112, conductive pad 111, and/or die 110.

In general, block 1050 may comprise forming a conductive post. Accordingly, the scope of this disclosure should not be limited by characteristics of any particular type of conductive post or by any particular manner of forming a conductive post.

The example method 1000 may, at block 1060, comprise applying a film. Block 1060 may comprise applying the film in any of a variety of manners, non-limiting examples of which are provided herein.

Block 1060 may comprise applying the film to contact and completely cover the top end surface of the conductive post (e.g., formed at block 1050). The film may also, for example, contact and cover an upper end portion of the lateral side surface of the conductive post (e.g., a portion of the lateral side surface that connects to the top end surface of the conductive post). For example, in an example implementation, the film may laterally surround at least an upper 10% of the lateral side surface of the conductive post. In another example implementation, the film may laterally surround at least an upper 20% of the lateral side surface of the conductive post. The example, the film may wrap around the top portion of the conductive post, but need not.

In an example implementation, a first area (or portion) of the film (e.g., a bottom surface thereof) may contact and cover the top end surface of the conductive post, a second area (or portion) of the film may contact and cover an upper end portion of the lateral side surface of the conductive post, and a third area (or portion) of the film (e.g., a bottom surface thereof) may be positioned above the second dielectric layer and define an upper boundary of a cavity in which an encapsulating layer may be formed (e.g., at block 1070). In an example implementation, the top surface of the third area may, for example, be positioned at a lower level than the bottom surface of the first area. For example, the vertical height (or amount) of the upper end portion of the lateral side surface of the conductive post that is covered by the film may be greater than a thickness of the film.

A lower end portion of the lateral side surface of the conductive post may be covered (or surrounded) by the second dielectric layer. A middle portion of the lateral side surface of the conductive post may be exposed, for example exposed to encapsulating material formed at block 1070. In an example implementation, at least half of the lateral side surface of the conductive post may be exposed. In another example implementation, at least a third of the lateral side surface of the conductive post may be exposed. This exposed middle portion of the conductive post may, for example, correspond to a space (or gap) between the bottom surface of the film and the top surface of the second dielectric layer. This space (or gap) may, for example, be filled with an encapsulating layer or material (e.g., at block 1070).

The film may comprise any of a variety of characteristics. For example, the film may comprise a preformed sheet, tape, film, etc. that may be positioned, stacked, and/or pressed down upon the conductive post. In an example implementation, a mold tool (e.g., an upper mold portion or chase) may press the film down onto and/or over the conductive post. The mold tool may then, for example, hold the film in position while encapsulating material is injected or otherwise formed in the space (or gap) between the film and the second dielectric layer. In such an example implementation, the mold tool may apply a generally uniform pressure to the film (e.g., the entire film being utilized) during the molding process.

Figure 2F:
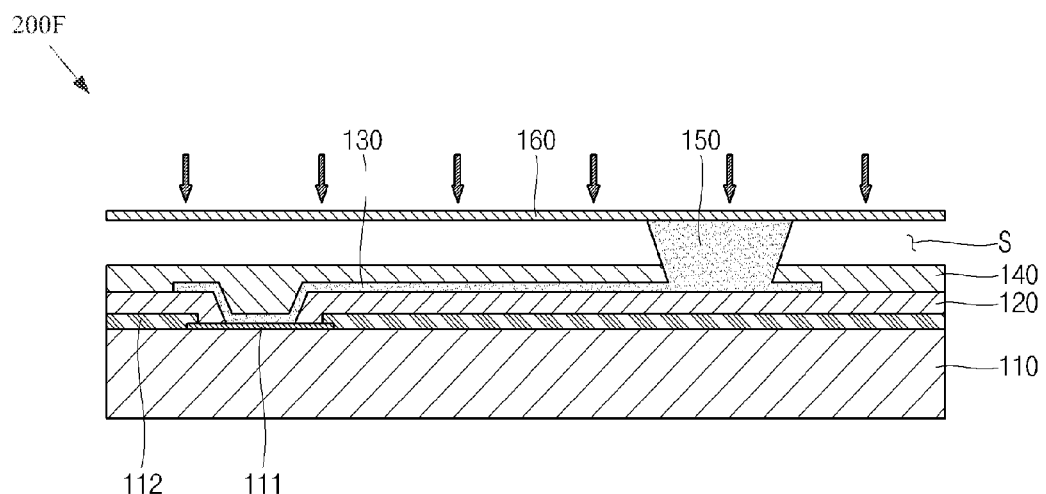
Figure 2G:
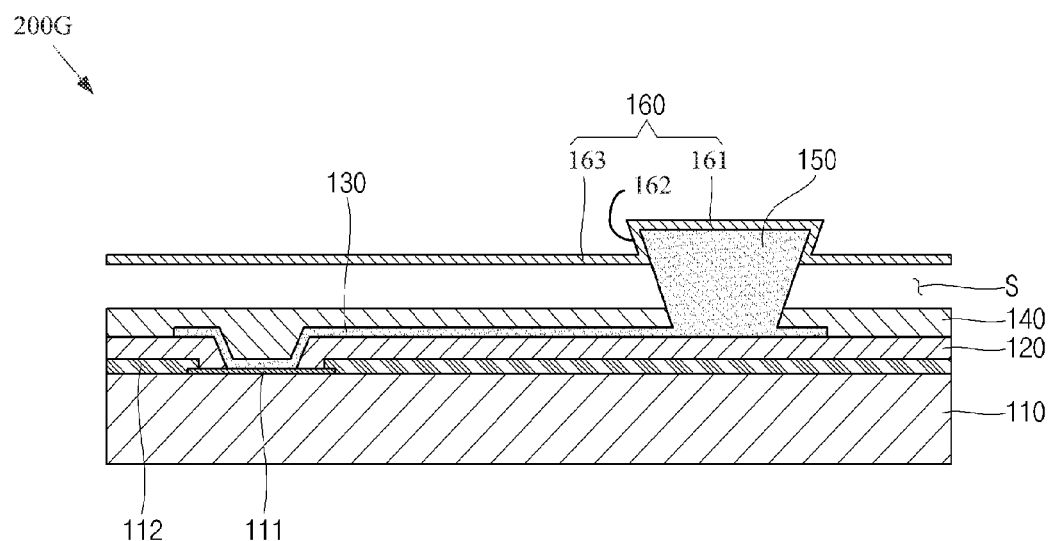

An example implementation 200F and 200G showing various aspects of block 1060 is shown at FIGS. 2F and 2G. The example implementation 200F shows the film 160 being stacked (or positioned) on the top end surface of the conductive post 150 and over (or above) the second dielectric layer 140. The film 160 is then pressed down onto the conductive post 150.

The example implementation 200G shows the pressed film 160 contacting and covering the top end surface of the conductive post 150 and an upper portion of the lateral side surface of the conductive post 150. In particular, a first area (or portion) 161 of the film 160 (e.g., a bottom surface thereof) contacts and covers the top end surface of the conductive post 150, a second area (or portion) 162 of the film 160 contacts and covers an upper end portion of the lateral side surface of the conductive post 150, and a third area (or portion) 163 of the film 160 (e.g., a bottom surface thereof) is positioned above the second dielectric layer 140 and defines an upper boundary of a space or cavity S in which an encapsulating layer may be formed (e.g., at block 1070). The top surface of the third area 163 may, for example, be positioned at a lower level than the bottom surface of the first area 161. For example, the vertical height (or amount) of the upper end portion of the lateral side surface of the conductive post 150 that is covered by the film 160 may be greater than a thickness of the film 160. Note that in another example implementation, the thickness of the film 160 may be greater than the vertical height (or amount) of the upper end portion of the lateral side surface of the conductive post 150 that is covered by the film 160.

A lower end portion of the lateral side surface of the example conductive post 150 is covered (or surrounded) by the second dielectric layer 140. A middle portion of the lateral side surface of the conductive post 150 is exposed (e.g., not covered by the film 160 or the second dielectric layer 140), for example exposed to encapsulating material formed at a later process. In the example implementation, about half or at least half of the lateral side surface of the conductive post 150 is exposed. In another example implementation (not shown), at least a third of the lateral side surface of the conductive post 150 may be exposed. This exposed middle portion of the conductive post may, for example, correspond to a space (or gap) between the bottom surface of the film 160 (e.g., the third area 163 thereof) and the top surface of the second encapsulant 140. This space (or gap) may, for example, be filled with an encapsulating material.

As shown in FIG. 2G, a portion of the second area 162 of the film 160 is positioned directly vertically between a portion (e.g., a top portion) of the conductive post 150 and the semiconductor die 110, die dielectric layer 112, first dielectric layer 120, conductive layer 130, and second conductive layer 140. For example, the film 160 may undercut a top portion of the conductive post 150, but such undercut is not necessary.

In general, block 1060 may comprise applying a film. Accordingly, the scope of this disclosure should not be limited by characteristics of any particular type of film or by any particular manner of applying a film.

The example method 1000 may, at block 1070, comprise forming an encapsulating layer. Block 1070 may comprise forming the encapsulating layer in any of a variety of manners, non-limiting examples of which are provided herein.

Block 1070 may, for example, comprise forming the encapsulating layer in the space (or gap) between the film (e.g., applied at block 1060) and the second dielectric layer (e.g., formed at block 1040). Block 1070 might not, however, form the encapsulating layer to cover the top end surface of the conductive post and/or the upper top portion of the lateral side surface of the conductive post, which are covered by the film applied at block 1060. For example, the top end of the conductive post (e.g., including the top end surface and/or the upper portion of the lateral side surface covered by the film) may extend upward from the top surface of the encapsulating layer.

The encapsulating layer may comprise any of a variety of encapsulating or molding materials (e.g., resin, epoxy resin, silicone resin, polymer, polymer composite material (for example, epoxy resin with filler, epoxy acrylate with filler, or polymer with a proper filler), combinations thereof, equivalents thereof, etc., but the scope of this disclosure is not limited thereto. The encapsulating layer may, for example, comprise any of the dielectric materials discussed herein. Note that the encapsulating layer may comprise one or more layers of same or different encapsulating material.

Block 1070 may, for example, comprise forming the encapsulating layer in any of a variety of manners, for example a film-assisted molding process (e.g., transfer molding, liquid encapsulant molding, compression molding, etc.), but the scope of this disclosure is not limited thereto. As discussed herein, block 1070 (or generally any or all of the processes discussed herein) may be performed at the semiconductor wafer level or panel level, or at the individual die (or component) level.

Figure 2H:
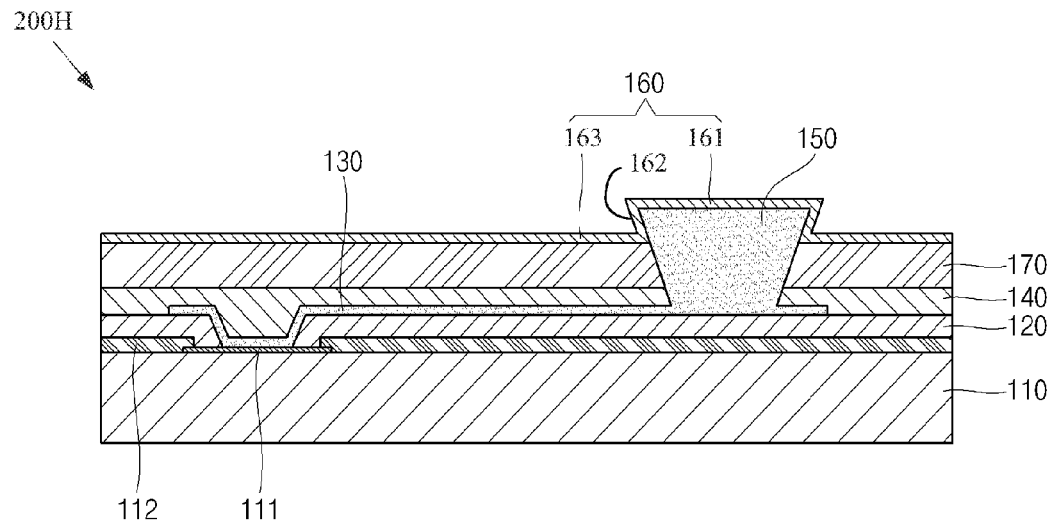

An example implementation 200H showing various aspects of block 1070 is shown at FIG. 2H. The example implementation 200H, for example relative to the example implementation 200G shown in FIG. 2G, shows the encapsulating layer 170 formed in the space S between the film 160 (or a bottom surface thereof) and the second dielectric layer 140 (or a top surface thereof). The encapsulating layer 170 contacts, covers, and surrounds a middle portion of the lateral side surface of the conductive post 150 (e.g., the portion of the lateral side surface of the conductive post 150 that is not covered by the film 160 or the second dielectric layer 140).

In general, block 1070 may comprise forming an encapsulating layer. Accordingly, the scope of this disclosure should not be limited by characteristics of any particular type of encapsulating layer or by any particular manner of forming an encapsulating layer.

The example method 1000 may, at block 1080, comprise removing the applied film (e.g., the film applied at block 1060). Block 1080 may comprise removing the film in any of a variety of manners, non-limiting examples of which are provided herein.

Block 1080 may, for example, comprise pulling (or peeling) the film away from the assembly (e.g., away from the encapsulating layer and the conductive post, etc.), for example when a portion of the mold (e.g., an upper mold chase, etc.) is pulled away from the assembly after forming the encapsulating layer at block 1070. Also for example, block 1080 may comprise pulling (or peeling) the film away from the assembly after the mold (e.g., an upper mold chase, etc.) is pulled away from the assembly. For example, a mechanism for pulling away a used portion of the film and for pulling in a new portion of the film may be utilized after the mold tool opens. Block 1080 may also, for example, comprise utilizing chemicals to remove (or clean) the film from the assembly (e.g., by dissolving, etching, etc.).

Figure 2I:
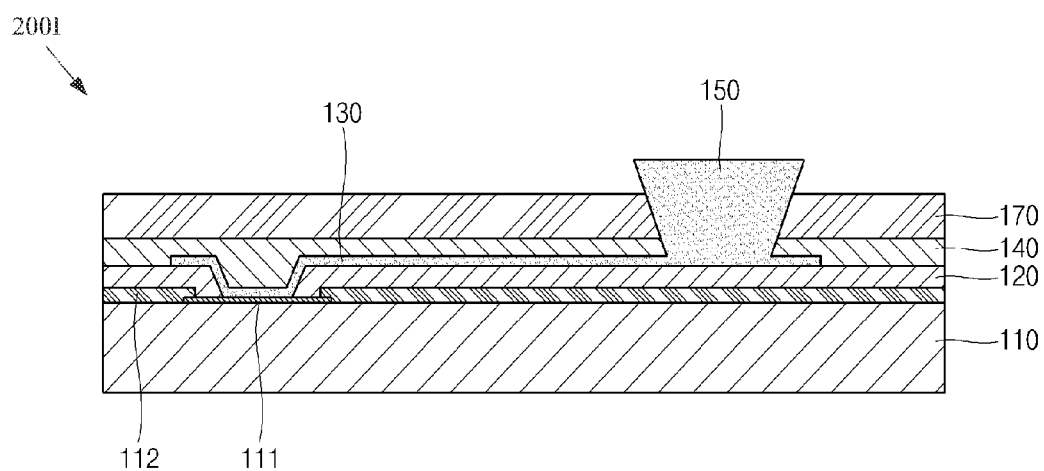

An example implementation 200I showing various aspects of block 1080 is shown at FIG. 2I. The example implementation 200I, for example relative to the example implementation 200H shown in FIG. 2H, shows the film 160 removed from the example implementation 200I. The top end surface and the upper portion of the lateral side surface of the conductive post 150 is shown protruding from the top side or surface of the encapsulating layer 170.

In general, block 1080 may comprise removing the applied film. Accordingly, the scope of this disclosure should not be limited by characteristics of any particular type of film or by any particular manner of removing a film.

The example method 1000 may, at block 1090, comprise forming an interconnection structure. Block 1090 may comprise forming an interconnection structure in any of a variety of manners, non-limiting examples of which are provided herein.

The interconnection structure may, for example, be formed to contact (e.g., directly or indirectly) the conductive post. For example, as discussed herein, an upper portion of the conductive post may protrude from the top surface of the encapsulating layer. In an example implementation, the entire part of the conductive post that protrudes from the top surface of the encapsulating layer may be surrounded by the interconnection structure. In another example implementation, the entire top end surface of the conductive post and only a portion of the lateral side surface of the conductive post that protrudes from the top surface of the encapsulating layer are surrounded by the interconnection structure. In yet another example implementation, only the top end surface of the conductive post is covered by the interconnection structure.

In an example implementation, the interconnection structure may have a vertical height (or upper end to lower end distance) that is greater than a vertical height (or upper end to lower end distance) of the conductive post. In another example implementation, the interconnection structure may have a vertical height that is less than a vertical height of the conductive post. For example, the interconnection structure may be flatter than the conductive post.

In an example implementation in which the top end of the conductive post is wider than the conductive post at the point of protrusion from the encapsulating layer, a portion of the interconnection structure may be positioned directly vertically between the conductive post (e.g., a top portion thereof) and the semiconductor die. For example, a portion of the interconnection structure may undercut the top end surface of the conductive post. Note that, as explained herein, such a difference in respective widths of different portions of the conductive post need not be present.

The interconnection structure may comprise characteristics of any of a variety of different types of interconnection structures. For example, the interconnection structure may comprise a conductive ball or bump (e.g., a solder ball or bump). The interconnection structure may, for example, comprise metal, conductive adhesive or epoxy, etc. The interconnection structure may, for example, comprise any of a variety of materials (e.g., copper, aluminum, nickel, iron, silver, gold, titanium, chromium, tungsten, tin, lead, combinations thereof, alloys thereof, equivalents thereof, etc.), but the scope of the present disclosure is not limited thereto.

Block 1090 may comprise forming the interconnection structure in any of a variety of manners (e.g., ball dropping, pasting and reflowing, plating, printing and curing or reflowing, etc.), but the scope of this disclosure is not limited thereto.

Figure 2J:
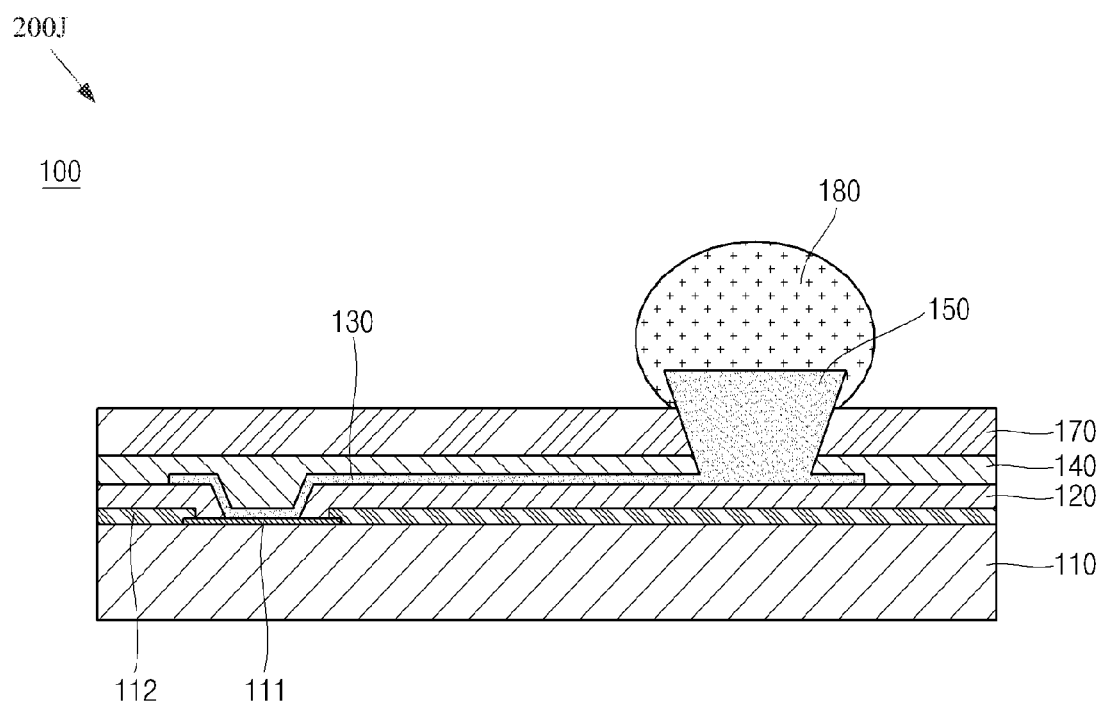

An example implementation 200J showing various aspects of block 1090 is shown at FIG. 2J. The example implementation 200J, for example relative to the example implementation 200I shown in FIG. 2I, shows the interconnection structure 180 on the conductive post 150.

The example interconnection structure 180, for example, contacts (e.g., directly or indirectly) the conductive post 150. For example, as discussed herein, an upper portion of the conductive post 150 may protrude from the top surface of the encapsulating layer 170. In the example implementation 200J, the entire part of the conductive post 150 that protrudes from the top surface of the encapsulating layer 170 is surrounded by the interconnection structure 180. The interconnection structure 180 may also, for example, contact a portion of the top surface of the encapsulating layer 170 in a region around the periphery of the conductive post 150.

The example interconnection structure 180 has a vertical height (or upper end to lower end distance) that is equal to or greater than a vertical height (or upper end to lower end distance) of the conductive post 150. In another implementation, the interconnection structure 180 may be shorter than the conductive post 150.

A portion of the interconnection structure 180 (e.g., around the upper end portion of the lateral side surface of the conductive post 150) is positioned directly vertically between the conductive post 150 (e.g., an upper portion thereof) and the semiconductor die 110. For example, a portion of the interconnection structure 180 undercuts the top end surface of the conductive post 150.

In general, block 1090 may comprise forming an interconnection structure. Accordingly, the scope of this disclosure should not be limited by characteristics of any particular type of interconnection structure or by any particular manner of forming an interconnection structure.

The example method 1000 may, for example at block 1095, comprise performing continued processing. Such continued processing may comprise performing any of a variety of continued processing operations. For example, block 1095 may comprise performing further encapsulating operations, forming signal distribution structures, coupling the electronic device to other electronic devices, packaging, shipping, marking, etc. In an example scenario in which the process steps discussed herein are performed at the wafer or panel level, block 1095 may comprise singulating individual assemblies (or package, sub-assemblies, etc.) from the wafer or panel. Block 1095 may also, for example, comprise directing execution flow of the example method 1000 to any other block (or sub-block) of the example method 1000 or any other method block or sub-block discussed herein.

In general, block 1095 may comprise performing continued processing. Accordingly, the scope of various aspects of this disclosure should not be limited by characteristics of any particular manner of performing continued processing.

The example electronic device 100 (a portion of which is shown at the example implementation 200J at FIG. 2J) may result from the example method 1000.

The order of various blocks of the example method 1000 may be changed without departing from the scope of this disclosure. In addition, various blocks may be omitted and/or added without departing from the scope of this disclosure. The discussion herein provides examples of omitting various blocks. For example, the examples provided in the discussion of FIGS. 3-4 generally correspond to the examples of FIGS. 1-2 with block 1040 (e.g., the forming of the second dielectric layer) omitted. Also for example, the examples provided in the discussion of FIGS. 5-6 generally correspond to the examples of FIGS. 1-2 with block 1020 (e.g., the forming of the first dielectric layer) and block 1040 (e.g., the forming of the second dielectric layer) omitted.

Figure 3:
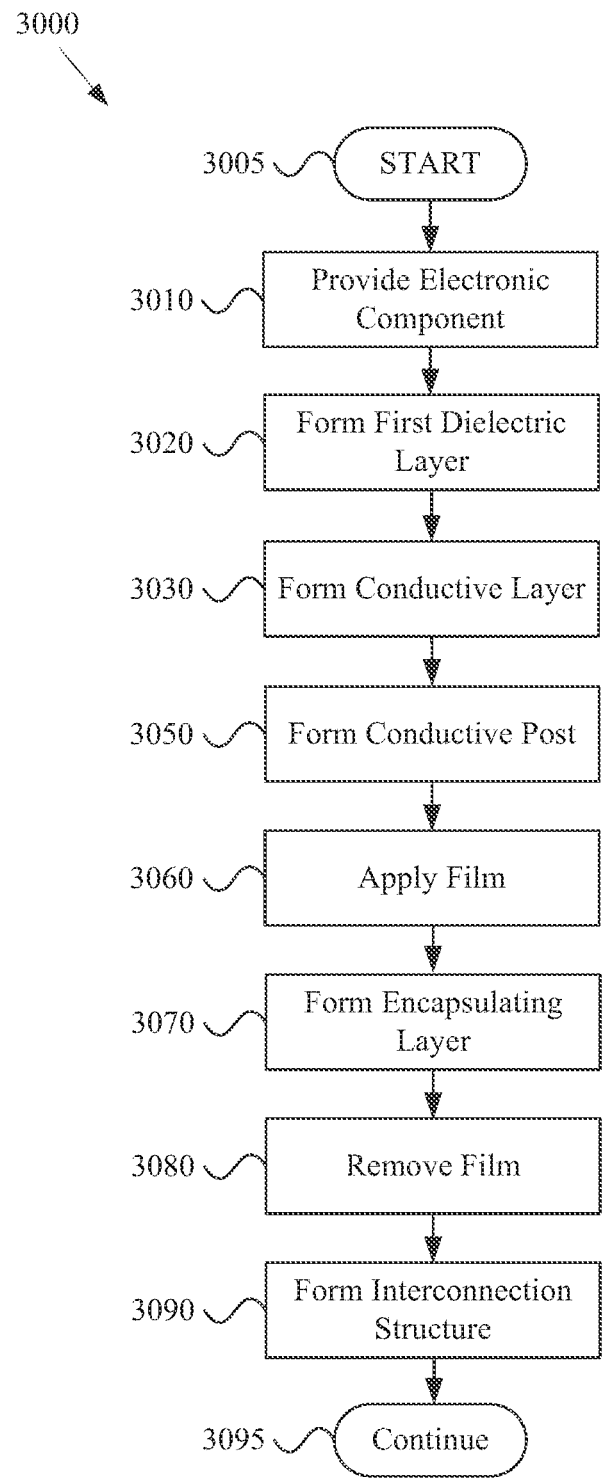
FIG. 3 shows a flow diagram of an example method of making an electronic device, in accordance with various aspects of the present disclosure.

FIG. 3 shows a flow diagram of an example method 3000 of making an electronic device, in accordance with various aspects of the present disclosure. The example method 3000 may, for example, share any or all characteristics with any other method discussed herein (e.g., the example method 1000 of FIG. 1, the example method 5000 of FIG. 5, etc.). FIGS. 4A-4D show cross-sectional views illustrating example electronic devices and example methods of making an electronic device, in accordance with various aspects of the present disclosure. The structures shown in 4A-4D may, for example, share any or all characteristics with analogous structures shown in FIGS. 2A-2J, FIGS. 6A-6E, etc. FIGS. 4A-4D may, for example, illustrate an example electronic device at various stages (or blocks) of the example method 3000 of FIG. 3. FIGS. 3 and 4A-4D will now be discussed together. It should be noted that the order of the example blocks of the example method 3000 may vary, various blocks may be omitted, and/or various blocks may be added without departing from the scope of this disclosure.

The example method 3000 may, at block 3010, comprise providing an electronic component for processing. Block 3010 may comprise providing the electronic component in any of a variety of manners, non-limiting examples of which are provided herein. Block 3010 may, for example, share any or all characteristics with block 1010 of the example method 1000 of FIG. 1, discussed herein.

The example method 3000 may, at block 3020, comprise forming a first dielectric layer. Block 3020 may comprise forming the first dielectric layer in any of a variety of manners, non-limiting examples of which are provided herein. Block 3020 may, for example, share any or all characteristics with block 1020 of the example method 1000 of FIG. 1, discussed herein.

The example method 3000 may, at block 3030, comprise forming a conductive layer. Block 3030 may comprise forming the conductive layer in any of a variety of manners, non-limiting examples of which are provided herein. Block 3030 may, for example, share any or all characteristics with block 1030 of the example method 1000 of FIG. 1, discussed herein.

Note that any or all of blocks 3020 and/or 3030 may be repeated any number of times, for example to create a multi-layered structure (e.g., a signal distribution structure, etc.) comprising a plurality of conductive layers and/or a plurality of dielectric layers.

The example method 3000 may, at block 3050, comprise forming a conductive post. Block 3050 may comprise forming the conductive post in any of a variety of manners, non-limiting examples of which are provided herein. Block 3050 may, for example, share any or all characteristics with block 1050 of the example method 1000 of FIG. 1, discussed herein, for example without the second dielectric layer formed at block 1040, the formation of which is omitted in this example. The conductive post may also be referred to as a conductive pillar, conductive bump, wire, interconnection structure, etc.

Block 3050 may, for example, comprise forming the conductive post on (e.g., directly on or indirectly on) an end region of the conductive layer. The conductive post is thus electrically and mechanically coupled to the conductive layer. In an example implementation, the conductive pad may be located generally at a first end of the conductive layer, and the conductive post may be located generally at a second end of the conductive layer.

In an example implementation, the conductive post may, for example, have a height that is greater than a width of the conductive post. Also for example, the vertical height (e.g., distance between a top end and a bottom end) of the conductive post may be substantially greater than a vertical thickness of the conductive layer formed at block 3030 (e.g., five to ten times thicker, greater than ten times thicker, greater than twenty times thicker, etc.).

The conductive post may, for example, be formed directly on the conductive layer (e.g., without or without a seed layer) or the conductive post may be formed on intervening metallic layers formed on the conductive pad before the conductive layer (e.g., under bump metallization layers, etc.).

The conductive post may comprise any of a variety of materials (e.g., copper, aluminum, nickel, iron, silver, gold, titanium, chromium, tungsten, combinations thereof, alloys thereof, etc.), but the scope of the present disclosure is not limited thereto. The conductive post may, for example, comprise the same conductive material as the conductive layer and/or conductive pad, but such structures may also comprise different respective materials. In an example implementation, the conductive post, conductive layer, and conductive pad may each comprise copper. Note that the conductive post (or other conductive structures discloses herein) may also comprise conductive epoxies, pastes, etc.

Block 3050 may comprise forming (or depositing) the conductive post utilizing any one or more of a variety of processes (e.g., electrolytic plating, electroless plating, chemical vapor deposition (CVD), sputtering or physical vapor deposition (PVD), plasma vapor deposition, printing, etc.), but the scope of the present disclosure is not limited thereto. In an example implementation, a seed layer may be formed (e.g., deposited, sputtered, etc.), a mask may be formed on the seed layer and patterned to cover areas of the seed layer that are not to be plated, the conductive layer may then be electroplated on the seed layer, and the mask and non-plated portions of the seed layer may then be removed (e.g., dissolved, etched, etc.). In another example implementation, the conductive layer may be formed without a seed layer (e.g., utilizing electroless plating, etc.). As discussed herein, block 3050 (or generally any or all of the processes discussed herein) may be performed at the semiconductor wafer level or panel level, or at the individual die (or component) level.

Figure 4A:
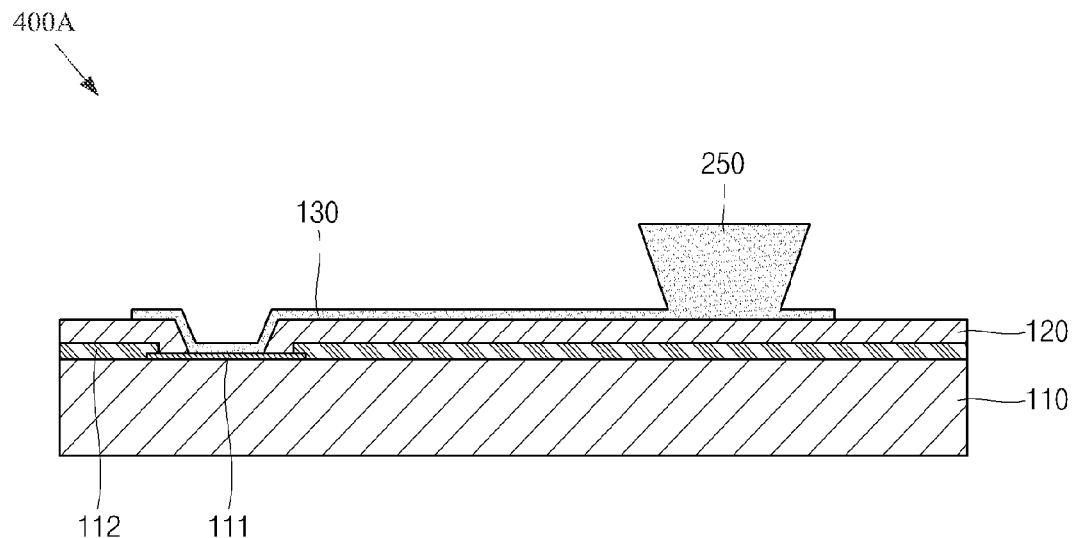
FIGS. 4A-4D show cross-sectional views illustrating example electronic devices and example methods of making an electronic device, in accordance with various aspects of the present disclosure.

An example implementation 400A showing various aspects of block 3050 is shown at FIG. 4A. The example implementation 400A (or assembly, sub-assembly, package, etc.) comprises a conductive post 250 formed on (e.g., directly on) an end portion of the conductive layer 130. The conductive post 250 is thus electrically and mechanically coupled to the conductive layer 130.

In the example implementation 400A, the conductive post 250 comprises tapered side surfaces, for example as may be formed in tapered mask apertures in a mask utilized during the post-forming process. The example conductive post 250 is thus wider (e.g., laterally wider) at a top end of the conductive post 250 than at a bottom end of the conductive post 250 (e.g., at the conductive layer 130). In the example implementation 400A, the conductive post 250 is shown with a constant taper from the bottom end to the top end, but such taper need not be constant. There may, for example, be a sharp corner (or surface discontinuity) at the junction between the top end surface of the conductive post 250 and the lateral side surface. Additionally, in another example implementation, the conductive post 250 may comprise one or more vertical side surfaces extending between the bottom end and the top end surface. Further, the top end surface of the conductive post 250 is shown to be planar and generally parallel to the top and bottom surfaces of the conductive layer 130, first dielectric layer 120, die dielectric layer 112, conductive pad 111, and/or die 110.

In general, block 3050 may comprise forming a conductive post. Accordingly, the scope of this disclosure should not be limited by characteristics of any particular type of conductive post or by any particular manner of forming a conductive post.

The example method 3000 may, at block 3060, comprise applying a film. Block 3060 may comprise applying the film in any of a variety of manners, non-limiting examples of which are provided herein. Block 3060 may, for example, share any or all characteristics with block 1060 of the example method 1000 of FIG. 1, discussed herein.

Block 3060 may comprise applying the film to contact and completely cover the top end surface of the conductive post (e.g., formed at block 3050). The film may also, for example, contact and cover an upper end portion of the lateral side surface of the conductive post (e.g., a portion of the lateral side surface that connects to the top end surface of the conductive post). For example, in an example implementation, the film may laterally surround at least an upper 10% of the lateral side surface of the conductive post. In another example implementation, the film may laterally surround at least an upper 20% of the lateral side surface of the conductive post. For example, the film may wrap around the top portion of the conductive post, but need not.

In an example implementation, a first area (or portion) of the film (e.g., a bottom surface thereof) may contact and cover the top end surface of the conductive post, a second area (or portion) of the film may contact and cover an upper end portion of the lateral side surface of the conductive post, and a third area (or portion) of the film (e.g., a bottom surface thereof) may be positioned above the first dielectric layer and the conductive layer and define an upper boundary of a cavity in which an encapsulating layer may be formed (e.g., at block 3070). In an example implementation, the top surface of the third area may, for example, be positioned at a lower level than the bottom surface of the first area. For example, the vertical height (or amount) of the upper end portion of the lateral side surface of the conductive post that is covered by the film may be greater than a thickness of the film.

A lower end portion and middle portion of the lateral side surface of the conductive post may be exposed (e.g., not covered by the film), for example exposed to encapsulating material formed at block 3070. In an example implementation, at least half of the lateral side surface of the conductive post may be exposed. In another example implementation, at least a third of the lateral side surface of the conductive post may be exposed. This exposed portion of the conductive post may, for example, correspond to a space (or gap) between the bottom surface of the film and the top surface of the first dielectric layer and conductive layer. This space (or gap) may, for example, be filled with an encapsulating layer or material (e.g., at block 3070).

The film may comprise any of a variety of characteristics. For example, the film may comprise a preformed sheet, tape, film, etc. that may be positioned, stacked, and/or pressed down upon the conductive post. In an example implementation, a mold tool (e.g., an upper mold portion or chase) may press the film down onto and/or over the conductive post. The mold tool may then, for example, hold the film in position while encapsulating material is injected or otherwise formed in the space (or gap) between the film and the first dielectric layer and conductive layer. In such an example implementation, the mold tool may apply a generally uniform pressure to the film (e.g., the entire film being utilized) during the molding process.

Figure 4B:
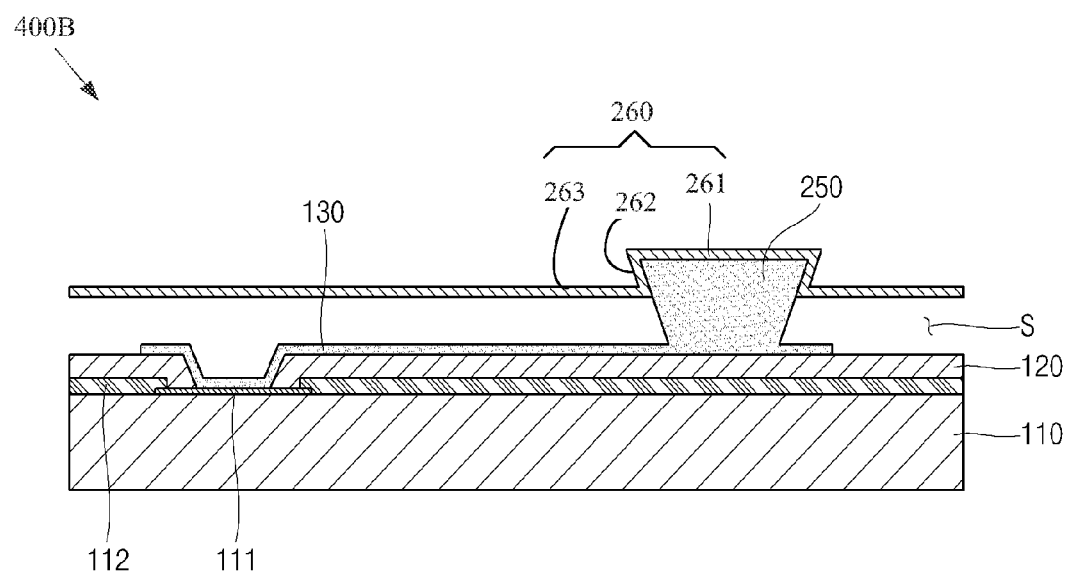

An example implementation 400B showing various aspects of block 3060 is shown at FIG. 4B. The example implementation 400B shows the film 260 stacked (or positioned) on the top end surface of the conductive post 250 and over (or above) the first dielectric layer 120 and conductive layer 130. The film 260 is also pressed down onto the conductive post 250.

The example implementation 400B shows the pressed film 260 contacting and covering the top end surface of the conductive post 250 and an upper portion of the lateral side surface of the conductive post 250. In particular, a first area (or portion) 261 of the film 260 (e.g., a bottom surface thereof) contacts and covers the top end surface of the conductive post 250, a second area (or portion) 262 of the film 260 contacts and covers an upper end portion of the lateral side surface of the conductive post 250, and a third area (or portion) 263 of the film 260 (e.g., a bottom surface thereof) is positioned above the first dielectric layer 120 and the conductive layer 130 and defines an upper boundary of a space or cavity S in which an encapsulating layer may be formed (e.g., at block 3070). The top surface of the third area 263 may, for example, be positioned at a lower level than the bottom surface of the first area 261. For example, the vertical height (or amount) of the upper end portion of the lateral side surface of the conductive post 250 that is covered by the film 260 may be greater than a thickness of the film 260. Note that in another example implementation, the thickness of the film 260 may be greater than the vertical height (or amount) of the upper end portion of the lateral side surface of the conductive post 250 that is covered by the film 260.

A lower end portion and a middle portion of the lateral side surface of the conductive post 250 is exposed (e.g., not covered by the film 260), for example exposed to encapsulating material formed at a later process. In the example implementation, about half or at least half of the lateral side surface of the conductive post 250 is exposed. In another example implementation (not shown), at least a third of the lateral side surface of the conductive post 250 may be exposed. This exposed portion of the conductive post 250 may, for example, correspond to a space (or gap) between the bottom surface of the film 260 (e.g., the third area 263 thereof) and the top surface of the first dielectric layer 120 and conductive layer 130. This space (or gap) may, for example, be filled with an encapsulating material.

As shown in FIG. 4B, a portion of the second area 262 of the film 260 is positioned directly vertically between a portion (e.g., a top portion) of the conductive post 250 and the semiconductor die 110, die dielectric layer 112, first dielectric layer 120, and conductive layer 130. For example, the film 260 may undercut a top portion of the conductive post 250, but such undercut is not necessary.

In general, block 3060 may comprise applying a film. Accordingly, the scope of this disclosure should not be limited by characteristics of any particular type of film or by any particular manner of applying a film.

The example method 3000 may, at block 3070, comprise forming an encapsulating layer. Block 3070 may comprise forming the encapsulating layer in any of a variety of manners, non-limiting examples of which are provided herein. Block 3070 may, for example, share any or all characteristics with block 1070 of the example method 1000 of FIG. 1 (e.g., without the second dielectric layer formed at block 1040), discussed herein.

Block 3070 may, for example, comprise forming the encapsulating layer in the space (or gap) between the film (e.g., applied at block 3060) and the first dielectric layer (e.g., formed at block 3040) and the conductive layer (e.g., formed at block 3030). Block 3070 might not, however, form the encapsulating layer to cover the top end surface of the conductive post and/or the upper top portion of the lateral side surface of the conductive post, which are covered by the film applied at block 3060. For example, the top end of the conductive post (e.g., including the top end surface and/or the upper portion of the lateral side surface covered by the film) may extend upward from the top surface of the encapsulating layer.

The encapsulating layer may comprise any of a variety of encapsulating or molding materials (e.g., resin, epoxy resin, silicone resin, polymer, polymer composite material (for example, epoxy resin with filler, epoxy acrylate with filler, or polymer with a proper filler), combinations thereof, equivalents thereof, etc., but the scope of this disclosure is not limited thereto. The encapsulating layer may, for example, comprise any of the dielectric materials discussed herein. Note that the encapsulating layer may comprise one or more layers of same or different encapsulating material.

Block 3070 may, for example, comprise forming the encapsulating layer in any of a variety of manners, for example a film-assisted molding process (e.g., transfer molding, liquid encapsulant molding, compression molding, etc.), but the scope of this disclosure is not limited thereto. As discussed herein, block 3070 (or generally any or all of the processes discussed herein) may be performed at the semiconductor wafer level or panel level, or at the individual die (or component) level.

Figure 4C:
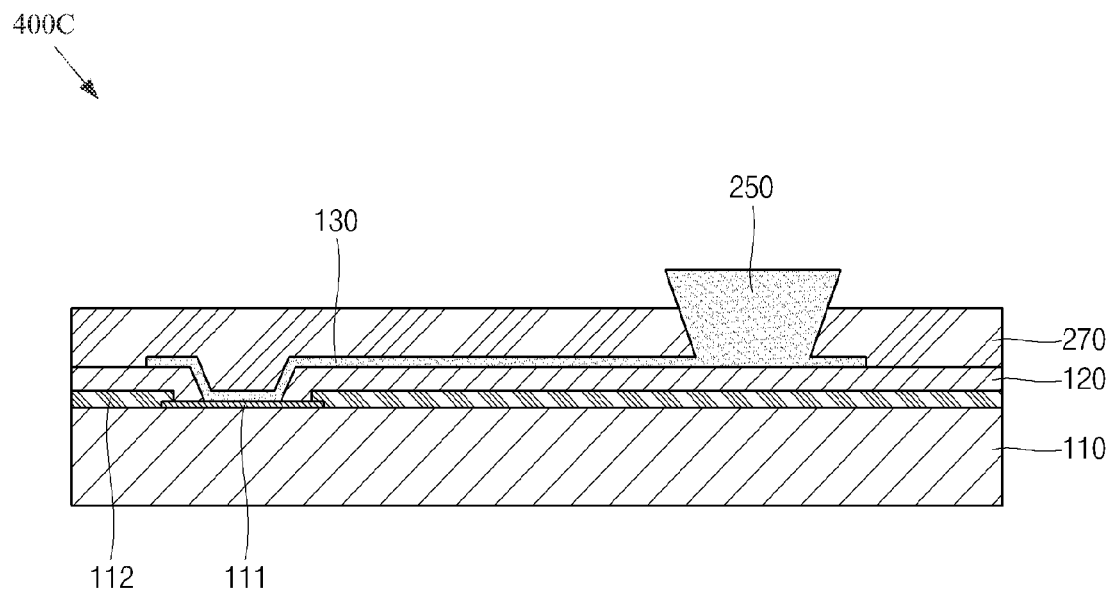

An example implementation 400C showing various aspects of block 3070 is shown at FIG. 4C. The example implementation 400C, for example relative to the example implementation 400B shown in FIG. 4B, shows the encapsulating material 270 formed in the space S between the film 260 (or a bottom surface thereof) and the first dielectric layer 120 (or a top surface thereof) and the conductive layer 130. The encapsulating layer 270 contacts, covers, and surrounds a middle portion and a lower portion of the lateral side surface of the conductive post 250 (e.g., the portion of the lateral side surface of the conductive post 150 that is not covered by the film 260).

In general, block 3070 may comprise forming an encapsulating layer. Accordingly, the scope of this disclosure should not be limited by characteristics of any particular type of encapsulating layer or by any particular manner of forming an encapsulating layer.

The example method 3000 may, at block 3080, comprise removing the applied film (e.g., the film applied at block 3060). Block 3080 may comprise removing the film in any of a variety of manners, non-limiting examples of which are provided herein. Block 3080 may, for example, share any or all characteristics with block 1080 of the example method 1000 of FIG. 1, discussed herein.

An example implementation 400C showing various aspects of block 3080 is shown at FIG. 4C. The example implementation 400C, for example relative to the example implementation 400B shown in FIG. 4B, shows the film 260 removed from the example implementation 400C. The top end surface and the upper end portion of the lateral side surface of the conductive post 250 is shown protruding from the top side or surface of the encapsulating layer 270.

In general, block 3080 may comprise removing the applied film. Accordingly, the scope of this disclosure should not be limited by characteristics of any particular type of film or by any particular manner of removing a film.

The example method 3000 may, at block 3090, comprise forming an interconnection structure. Block 3090 may comprise forming an interconnection structure in any of a variety of manners, non-limiting examples of which are provided herein. Block 3090 may, for example, share any or all characteristics with block 1090 of the example method 1000 of FIG. 1, discussed herein.

Figure 4D:
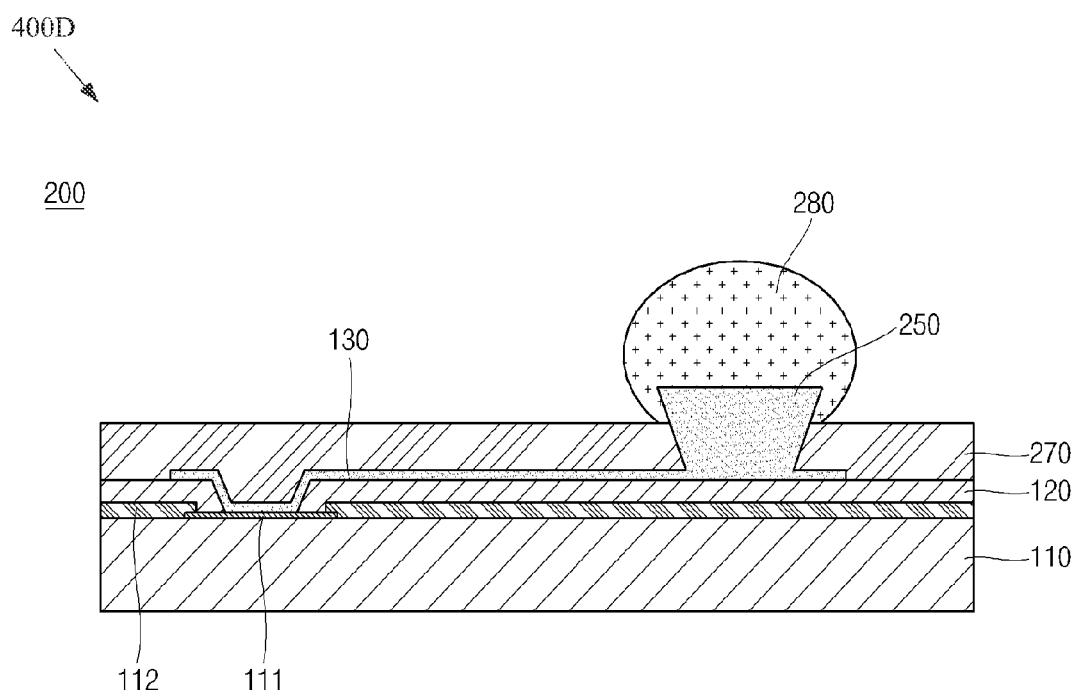

An example implementation 400D showing various aspects of block 3090 is shown at FIG. 4D. The example implementation 400D, for example relative to the example implementation 400C shown in FIG. 4C, shows the interconnection structure 280 on the conductive post 250.

The example interconnection structure 280, for example, contacts (e.g., directly or indirectly) the conductive post 250. For example, as discussed herein, an upper portion of the conductive post 250 may protrude from the top surface of the encapsulating layer 270. In the example implementation 400D, the entire part of the conductive post 250 that protrudes from the top surface of the encapsulating layer 270 is surrounded by the interconnection structure 280. The interconnection structure 280 may also, for example, contact a portion of the top surface of the encapsulating layer 270 in a region around the periphery of the conductive post 250.

The example interconnection structure 280 has a vertical height (or upper end to lower end distance) that is equal to or greater than a vertical height (or upper end to lower end distance) of the conductive post 250. In another implementation, the interconnection structure 280 may be shorter than the conductive post 250.

A portion of the interconnection structure 280 (e.g., around the upper end portion of the lateral side surface of the conductive post 250) is positioned directly vertically between the conductive post 250 (e.g., an upper portion thereof) and the semiconductor die 110. For example, a portion of the interconnection structure 280 undercuts the top end surface of the conductive post 250.

In general, block 3090 may comprise forming an interconnection structure. Accordingly, the scope of this disclosure should not be limited by characteristics of any particular type of interconnection structure or by any particular manner of forming an interconnection structure.

The example method 3000 may, for example at block 3095, comprise performing continued processing. Such continued processing may comprise performing any of a variety of continued processing operations. For example, block 3095 may comprise performing further encapsulating operations, forming signal distribution structures, coupling the electronic device to other electronic devices, packaging, shipping, marking, etc. In an example scenario in which the process steps discussed herein are performed at the wafer or panel level, block 3095 may comprise singulating individual assemblies (or package, sub-assemblies, etc.) from the wafer or panel. Block 3095 may also, for example, comprise directing execution flow of the example method 3000 to any other block (or sub-block) of the example method 3000 or any other method block or sub-block discussed herein.

In general, block 3095 may comprise performing continued processing. Accordingly, the scope of various aspects of this disclosure should not be limited by characteristics of any particular manner of performing continued processing.

The example electronic device 200 (a portion of which is shown at the example implementation 400D at FIG. 4D) may result from the example method 3000.

Figure 5:
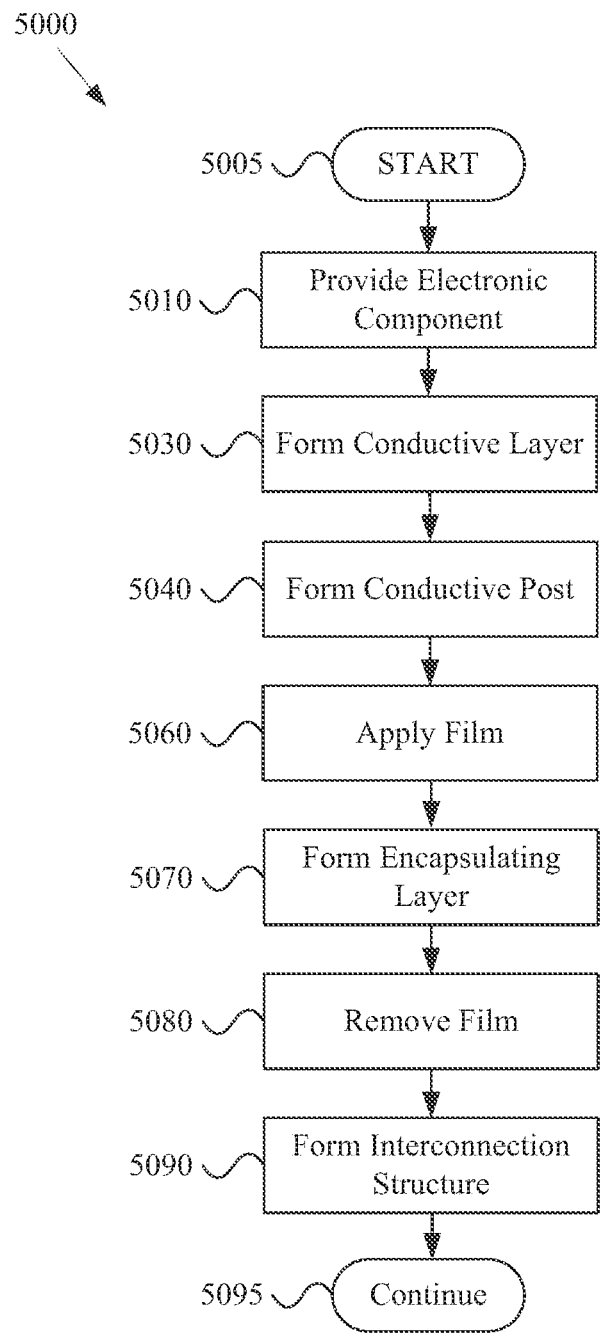
FIG. 5 shows a flow diagram of an example method of making an electronic device, in accordance with various aspects of the present disclosure.

FIG. 5 shows a flow diagram of an example method 5000 of making an electronic device, in accordance with various aspects of the present disclosure. The example method 5000 may, for example, share any or all characteristics with any other method discussed herein (e.g., the example method 1000 of FIG. 1, the example method 3000 of FIG. 3, etc.). FIGS. 6A-6E show cross-sectional views illustrating example electronic devices and example methods of making an electronic device, in accordance with various aspects of the present disclosure. The structures shown in 6A-6E may, for example, share any or all characteristics with analogous structures shown in FIGS. 2A-2J, FIGS. 4A-4D, etc. FIGS. 6A-6E may, for example, illustrate an example electronic device at various stages (or blocks) of the example method 5000 of FIG. 5. FIGS. 5 and 6A-6E will now be discussed together. It should be noted that the order of the example blocks of the example method 5000 may vary, various blocks may be omitted, and/or various blocks may be added without departing from the scope of this disclosure.

The example method 5000 may, at block 5010, comprise providing an electronic component for processing. Block 5010 may comprise providing the electronic component in any of a variety of manners, non-limiting examples of which are provided herein. Block 5010 may, for example, share any or all characteristics with block 1010 of the example method 1000 of FIG. 1, discussed herein.

The example method 5000 may, at block 5030, comprise forming a conductive layer. Block 3030 may comprise forming the conductive layer in any of a variety of manners, non-limiting examples of which are provided herein. Block 5030 may, for example, share any or all characteristics with block 1030 of the example method 1000 of FIG. 1, and/or with block 3030 of the example method 3000 of FIG. 3, for example without the first dielectric layer formed at blocks 1020 and 3020, discussed herein.

Block 5030 may, for example, comprise forming the conductive layer on (e.g., directly on or indirectly on) the central region of the conductive pad that is exposed by the aperture in the die dielectric layer. The conductive layer is thus electrically and mechanically coupled to the conductive pad.

The conductive layer may, for example, be formed directly on the conductive pad (e.g., with or without a seed layer) or the conductive layer may be formed on intervening metallic layers formed on the conductive pad before the conductive layer. The conductive layer may, for example, comprise a first portion formed in the aperture in the die dielectric layer, and a second portion formed on the top surface of the die dielectric layer.

The conductive layer may comprise any of a variety of materials (e.g., copper, aluminum, nickel, iron, silver, gold, titanium, chromium, tungsten, combinations thereof, alloys thereof, etc.), but the scope of the present disclosure is not limited thereto. The conductive layer may, for example, comprise the conductive material as the conductive pad. In an example implementation, the conductive layer and the conductive pad may both comprise copper and/or may be directly bonded to each other.

Block 5030 may comprise forming (or depositing) the conductive layer utilizing any one or more of a variety of processes (e.g., electrolytic plating, electroless plating, chemical vapor deposition (CVD), sputtering or physical vapor deposition (PVD), plasma vapor deposition, printing, etc.), but the scope of the present disclosure is not limited thereto. In an example implementation, a seed layer may be formed on the conductive pad and/or on the die dielectric layer (e.g., deposited, sputtered, etc.), a mask may be formed on the seed layer and patterned to cover areas of the seed layer that are not to be plated, the conductive layer (or portion thereof) may then be electroplated on the seed layer, and the mask and non-plated portions of the seed layer may be removed (e.g., dissolved, etched, etc.). In another example implementation, the conductive layer may be formed without a seed layer (e.g., utilizing electroless plating, etc.). As discussed herein, block 5030 (or generally any or all of the processes discussed herein) may be performed at the semiconductor wafer level or panel level, or at the individual die level.

Figure 6A:
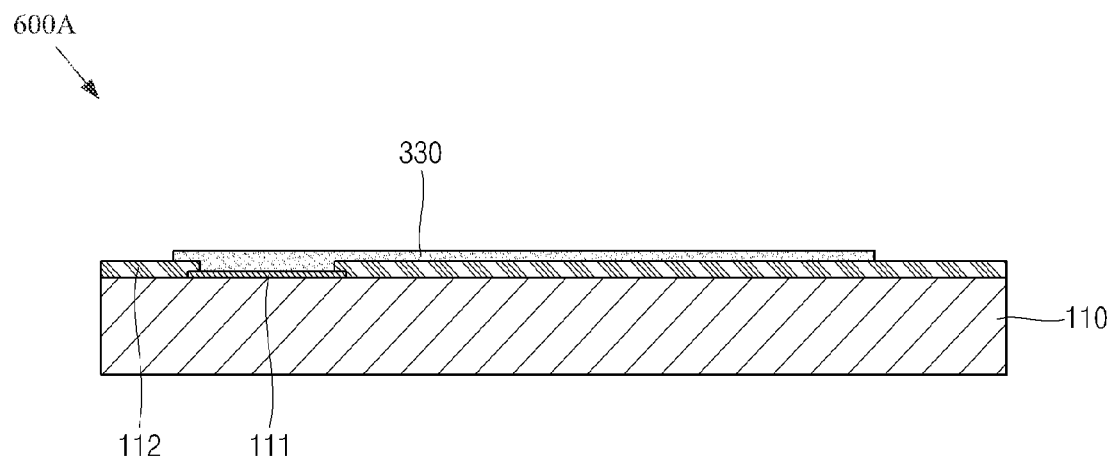
FIGS. 6A-6E show cross-sectional views illustrating example electronic devices and example methods of making an electronic device, in accordance with various aspects of the present disclosure.

An example implementation 600A showing various aspects of block 5030 is shown at FIG. 6A. The example implementation 600A (or assembly, sub-assembly, package, etc.) comprises a conductive layer 330 formed on (e.g., directly on) the die dielectric layer 112 and on a central region of the conductive pad 111 exposed through the aperture in the die dielectric layer 112. In the example implementation 600A, the conductive layer 330 does not directly contact the outermost peripheral ring of the conductive pad 111, which is covered by the die dielectric layer 112.

In general, block 5030 may comprise forming a conductive layer. Accordingly, the scope of this disclosure should not be limited by characteristics of any particular type of conductive layer or by any particular manner of forming a conductive layer The example method 5000 may, at block 5050, comprise forming a conductive post. Block 5050 may comprise forming the conductive post in any of a variety of manners, non-limiting examples of which are provided herein. Block 5050 may, for example, share any or all characteristics with block 1050 of the example method 1000 of FIG. 1, discussed herein, for example without the first dielectric layer formed at block 1020 and without the second dielectric layer formed at block 1040, the formation of which are omitted in this example. Block 5050 may, for example, share any or all characteristics with block 3050 of the example method 3000 of FIG. 3, discussed herein, for example, without the first dielectric layer formed at block 3020. The conductive post may also be referred to as a conductive pillar, conductive bump, interconnection structure, etc.

Block 5050 may, for example, comprise forming the conductive post on (e.g., directly on or indirectly on) an end region of the conductive layer. The conductive post is thus electrically and mechanically coupled to the conductive layer. In an example implementation, the conductive pad may be located generally at a first end of the conductive layer, and the conductive post may be located generally at a second end of the conductive layer.

In an example implementation, the conductive post may, for example, have a height that is greater than a width of the conductive post. Also for example, the vertical height (e.g., distance between a top end and a bottom end) of the conductive post may be substantially greater than a vertical thickness of the conductive layer formed at block 5030 (e.g., five to ten times thicker, greater than ten times thicker, greater than twenty times thicker, etc.).

The conductive post may, for example, be formed directly on the conductive layer (e.g., without or without a seed layer) or the conductive post may be formed on intervening metallic layers formed on the conductive pad before the conductive layer (e.g., under bump metallization layers, etc.).

The conductive post may comprise any of a variety of materials (e.g., copper, aluminum, nickel, iron, silver, gold, titanium, chromium, tungsten, combinations thereof, alloys thereof, etc.), but the scope of the present disclosure is not limited thereto. The conductive post may, for example, comprise the same conductive material as the conductive layer and/or conductive pad, but such structures may also comprise different respective materials. In an example implementation, the conductive post, conductive layer, and conductive pad may each comprise copper. Note that the conductive post (or other conductive structures discloses herein) may also comprise conductive epoxies, pastes, etc.

Block 5050 may comprise forming (or depositing) the conductive post utilizing any one or more of a variety of processes (e.g., electrolytic plating, electroless plating, chemical vapor deposition (CVD), sputtering or physical vapor deposition (PVD), plasma vapor deposition, printing, etc.), but the scope of the present disclosure is not limited thereto. In an example implementation, a seed layer may be formed (e.g., deposited, sputtered, etc.), a mask may be formed on the seed layer and patterned to cover areas of the seed layer that are not to be plated, the conductive layer may then be electroplated on the seed layer, and the mask and non-plated portions of the seed layer may then be removed (e.g., dissolved, etched, etc.). In another example implementation, the conductive layer may be formed without a seed layer (e.g., utilizing electroless plating, etc.). As discussed herein, block 5050 (or generally any or all of the processes discussed herein) may be performed at the semiconductor wafer level or panel level, or at the individual die (or component) level.

Figure 6B:
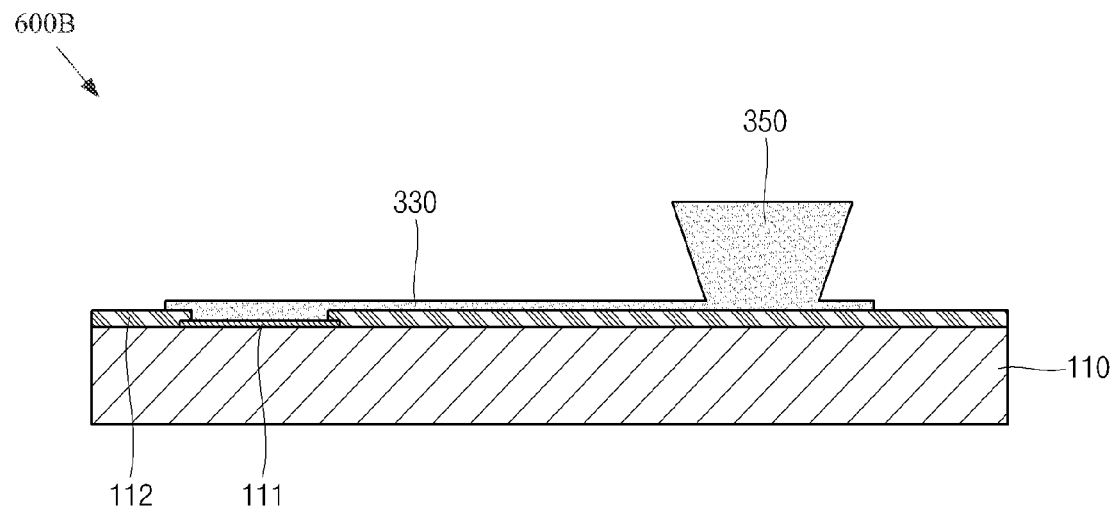

An example implementation 600B showing various aspects of block 5050 is shown at FIG. 6B. The example implementation 600B (or assembly, sub-assembly, package, etc.) comprises a conductive post 350 formed on (e.g., directly on) an end portion of the conductive layer 330. The conductive post 350 is thus electrically and mechanically coupled to the conductive layer 330.

In the example implementation 600B, the conductive post 350 comprises tapered side surfaces, for example as may be formed in tapered mask apertures in a mask utilized during the post-forming process. The example conductive post 350 is thus wider (e.g., laterally wider) at a top end of the conductive post 350 than at a bottom end of the conductive post 350 (e.g., at the conductive layer 330). In the example implementation 600B, the conductive post 350 is shown with a constant taper from the bottom end to the top end, but such taper need not be constant. There may, for example, be a sharp corner (or surface discontinuity) at the junction between the top end surface of the conductive post 350 and the lateral side surface. Additionally, in another example implementation, the conductive post 350 may comprise one or more vertical side surfaces extending between the bottom end and the top end surface. Further, the top end surface of the conductive post 350 is shown to be planar and generally parallel to the top and bottom surfaces of the conductive layer 330, die dielectric layer 112, conductive pad 111, and/or die 110.

In general, block 5050 may comprise forming a conductive post. Accordingly, the scope of this disclosure should not be limited by characteristics of any particular type of conductive post or by any particular manner of forming a conductive post.

The example method 3000 may, at block 5060, comprise applying a film. Block 5060 may comprise applying the film in any of a variety of manners, non-limiting examples of which are provided herein. Block 5060 may, for example, share any or all characteristics with block 1060 of the example method 1000 of FIG. 1, and/or with block 3060 of the example method 3000 of FIG. 3, discussed herein.

Block 5060 may comprise applying the film to contact and completely cover the top end surface of the conductive post (e.g., formed at block 5050). The film may also, for example, contact and cover an upper end portion of the lateral side surface of the conductive post (e.g., a portion of the lateral side surface that connects to the top end surface of the conductive post). For example, in an example implementation, the film may laterally surround at least an upper 10% of the lateral side surface of the conductive post. In another example implementation, the film may laterally surround at least an upper 20% of the lateral side surface of the conductive post. For example, the film may wrap around the top portion of the conductive post, but need not.

In an example implementation, a first area (or portion) of the film (e.g., a bottom surface thereof) may contact and cover the top end surface of the conductive post, a second area (or portion) of the film may contact and cover an upper end portion of the lateral side surface of the conductive post, and a third area (or portion) of the film (e.g., a bottom surface thereof) may be positioned above the die dielectric layer and the conductive layer and define an upper boundary of a cavity in which an encapsulating layer may be formed (e.g., at block 5070). In an example implementation, the top surface of the third area may, for example, be positioned at a lower level than the bottom surface of the first area. For example, the vertical height (or amount) of the upper end portion of the lateral side surface of the conductive post that is covered by the film may be greater than a thickness of the film.

A lower end portion and a middle portion of the lateral side surface of the conductive post may be exposed (e.g., not covered by the film), for example exposed to encapsulating material formed at block 5070. In an example implementation, at least half of the lateral side surface of the conductive post may be exposed. In another example implementation, at least a third of the lateral side surface of the conductive post may be exposed. This exposed portion of the conductive post may, for example, correspond to a space (or gap) between the bottom surface of the film and the top surface of the die dielectric layer and conductive layer. This space (or gap) may, for example, be filled with an encapsulating material (e.g., at block 5070).

The film may comprise any of a variety of characteristics. For example, the film may comprise a preformed sheet, tape, film, etc. that may be positioned, stacked, and/or pressed down upon the conductive post. In an example implementation, a mold tool (e.g., an upper mold portion or chase) may press the film down onto and/or over the conductive post. The mold tool may then, for example, hold the film in position while encapsulating material is injected or otherwise formed in the space (or gap) between the film and the die dielectric layer and conductive layer. In such an example implementation, the mold tool may apply a generally uniform pressure to the film (e.g., the entire film being utilized) during the molding process.

Figure 6C:
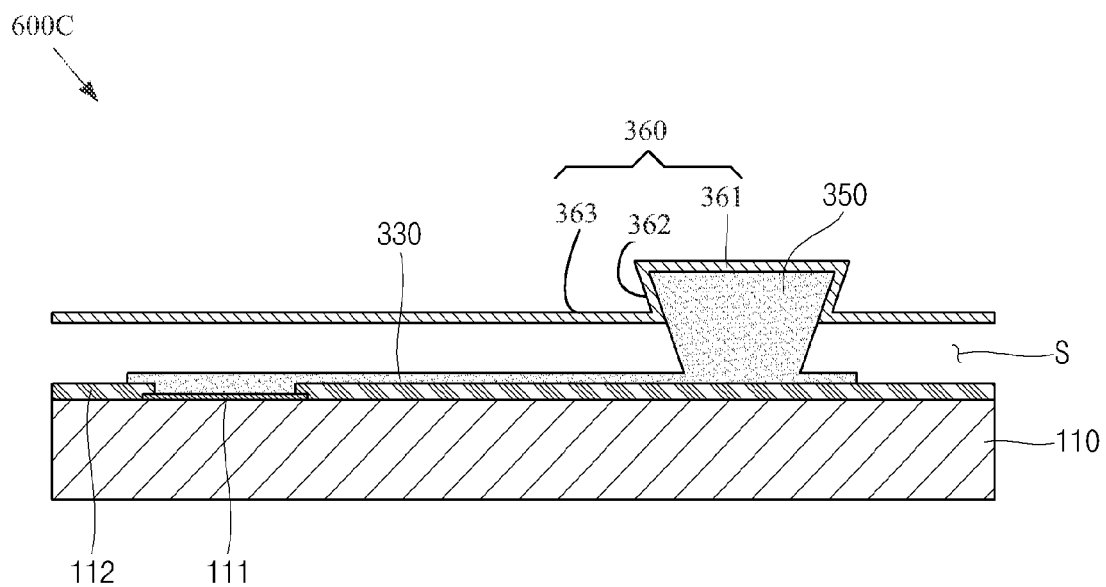

An example implementation 600C showing various aspects of block 5060 is shown at FIG. 6C. The example implementation 600C shows the film 360 stacked (or positioned) on the top end surface of the conductive post 350 and over (or above) the die dielectric layer 112 and conductive layer 130. The film 360 is then pressed down onto the conductive post 350.

The example implementation 600C shows the pressed film 360 contacting and covering the top end surface of the conductive post 350 and an upper portion of the lateral side surface of the conductive post 350. In particular, a first area (or portion) 361 of the film 360 (e.g., a bottom surface thereof) contacts and covers the top end surface of the conductive post 350, a second area (or portion) 362 of the film 360 contacts and covers an upper end portion of the lateral side surface of the conductive post 350, and a third area (or portion) 363 of the film 360 (e.g., a bottom surface thereof) is positioned above the die dielectric layer 112 and the conductive layer 330 and defines an upper boundary of a space or cavity S in which an encapsulating layer may be formed (e.g., at block 5070). The top surface of the third area 363 may, for example, be positioned at a lower level than the bottom surface of the first area 61. For example, the vertical height (or amount) of the upper end portion of the lateral side surface of the conductive post 350 that is covered by the film 360 may be greater than a thickness of the film 360. Note that in another example implementation, the thickness of the film 360 may be greater than the vertical height (or amount) of the upper end portion of the lateral side surface of the conductive post 350 that is covered by the film 360.

A lower end portion and a middle portion of the lateral side surface of the conductive post 350 is exposed (e.g., not covered by the film 360), for example exposed to encapsulating material formed at a later process. In the example implementation, about half or at least half of the lateral side surface of the conductive post 350 is exposed. In another example implementation (not shown), at least a third of the lateral side surface of the conductive post 350 may be exposed. This exposed portion of the conductive post 350 may, for example, correspond to a space (or gap) between the bottom surface of the film 360 (e.g., the third area 363 thereof) and the top surface of the die dielectric layer 112 and conductive layer 130. This space (or gap) may, for example, be filled with an encapsulating material.

As shown in FIG. 6C, a portion of the second area 362 of the film 360 is positioned directly vertically between a portion (e.g., a top portion) of the conductive post 350 and the semiconductor die 110, die dielectric layer 112, and conductive layer 130. For example, the film 360 may undercut a top portion of the conductive post 350, but such undercut is not necessary.

In general, block 5060 may comprise applying a film. Accordingly, the scope of this disclosure should not be limited by characteristics of any particular type of film or by any particular manner of applying a film.

The example method 5000 may, at block 5070, comprise forming an encapsulating layer. Block 5070 may comprise forming the encapsulating layer in any of a variety of manners, non-limiting examples of which are provided herein. Block 5070 may, for example, share any or all characteristics with block 1070 of the example method 1000 of FIG. 1 (e.g., without the second dielectric layer formed at block 1040 and without the first dielectric layer formed at block 1020), and/or with block 3070 of the example method 3000 of FIG. 3 (e.g., without the first dielectric layer formed at block 3020), discussed herein.

Block 5070 may, for example, comprise forming the encapsulating layer in the space (or gap) between the film (e.g., applied at block 5060) and the die dielectric layer and the conductive layer (e.g., formed at block 5030). Block 5070 might not, however, form the encapsulating layer to cover the top end surface of the conductive post and/or the upper top portion of the lateral side surface of the conductive post, which are covered by the film applied at block 5060. For example, the top end of the conductive post (e.g., including the top end surface and/or the upper portion of the lateral side surface covered by the film) may extend upward from the top surface of the encapsulating layer.

The encapsulating layer may comprise any of a variety of encapsulating or molding materials (e.g., resin, epoxy resin, silicone resin, polymer, polymer composite material (for example, epoxy resin with filler, epoxy acrylate with filler, or polymer with a proper filler), combinations thereof, equivalents thereof, etc., but the scope of this disclosure is not limited thereto. The encapsulating layer may, for example, comprise any of the dielectric materials discussed herein. Note that the encapsulating layer may comprise one or more layers of same or different encapsulating material.

Block 5070 may, for example, comprise forming the encapsulating layer in any of a variety of manners, for example a film-assisted molding process (e.g., transfer molding, liquid encapsulant molding, compression molding, etc.), but the scope of this disclosure is not limited thereto. As discussed herein, block 5070 (or generally any or all of the processes discussed herein) may be performed at the semiconductor wafer level or panel level, or at the individual die (or component) level.

Figure 6D:
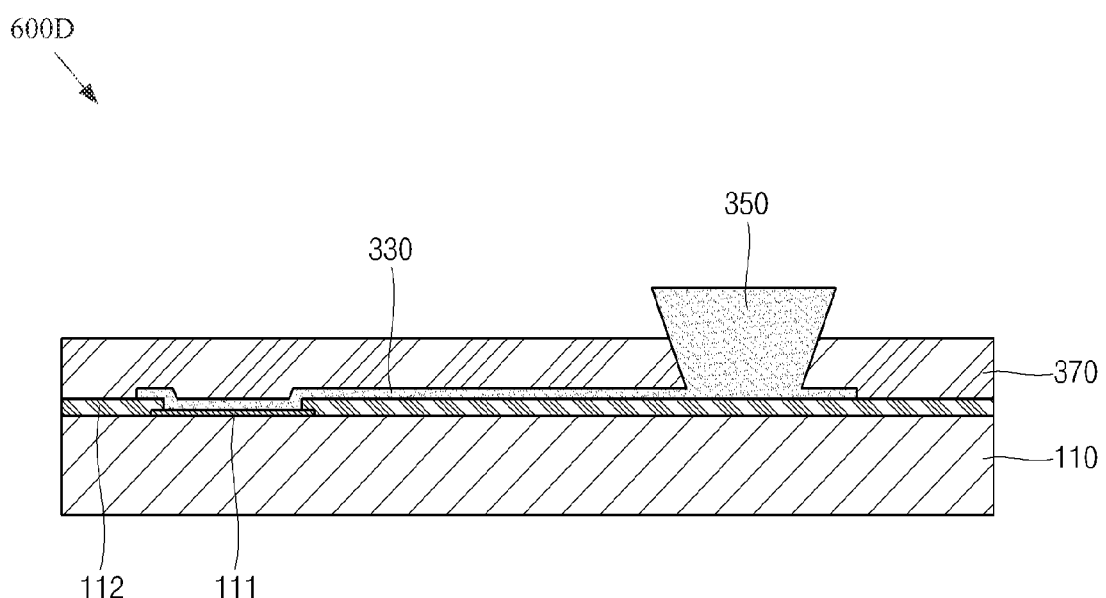

An example implementation 600D showing various aspects of block 5070 is shown at FIG. 6D. The example implementation 600D, for example relative to the example implementation 600C shown in FIG. 6C, shows the encapsulating material 370 formed in the space S between the film 360 (or a bottom surface thereof) and the die dielectric layer 112 (or a top surface thereof) and the conductive layer 130.

In general, block 5070 may comprise forming an encapsulating layer. Accordingly, the scope of this disclosure should not be limited by characteristics of any particular type of encapsulating layer or by any particular manner of forming an encapsulating layer.

The example method 5000 may, at block 5080, comprise removing the applied film (e.g., the film applied at block 5060). Block 5080 may comprise removing the film in any of a variety of manners, non-limiting examples of which are provided herein. Block 5030 may, for example, share any or all characteristics with block 1030 of the example method 1000 of FIG. 1, discussed herein.

An example implementation 600D showing various aspects of block 5080 is shown at FIG. 6D. The example implementation 600D, for example relative to the example implementation 600C shown in FIG. 6C, shows the film 360 removed from the example implementation 600D. The top end surface and the upper portion of the lateral side surface of the conductive post 350 is shown protruding from the top side or surface of the encapsulating layer 370.

In general, block 5080 may comprise removing the applied film. Accordingly, the scope of this disclosure should not be limited by characteristics of any particular type of film or by any particular manner of removing a film.

The example method 5000 may, at block 5090, comprise forming an interconnection structure. Block 5090 may comprise forming an interconnection structure in any of a variety of manners, non-limiting examples of which are provided herein. Block 5090 may, for example, share any or all characteristics with block 1090 of the example method 1000 of FIG. 1 (e.g., without the second dielectric layer formed at block 1040 and without the first dielectric layer formed at block 1020), and/or with block 3090 of the example method 3000 of FIG. 3 (e.g., without the first dielectric layer formed at block 3040), discussed herein.

Figure 6E:
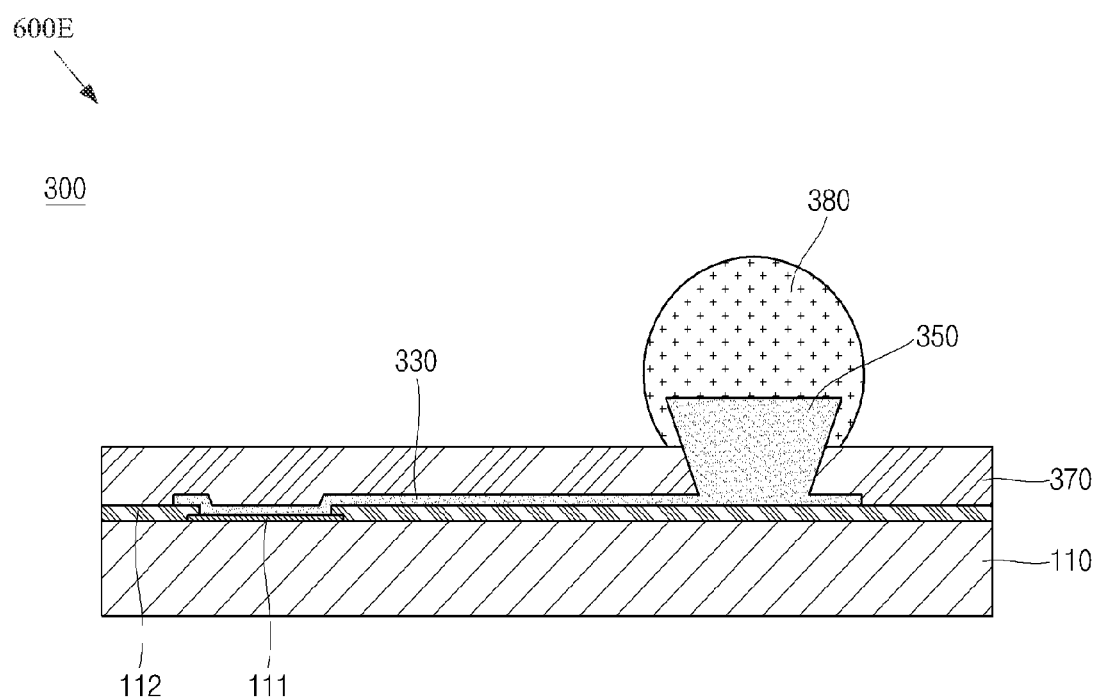

An example implementation 600E showing various aspects of block 5090 is shown at FIG. 6E. The example implementation 600E, for example relative to the example implementation 600D shown in FIG. 6D, shows the interconnection structure 380 on the conductive post 350.

The example interconnection structure 380, for example, contacts (e.g., directly or indirectly) the conductive post 350. For example, as discussed herein, an upper portion of the conductive post 350 may protrude from the top surface of the encapsulating layer 370. In the example implementation 600E, the entire part of the conductive post 350 that protrudes from the top surface of the encapsulating layer 370 is surrounded by the interconnection structure 380. The interconnection structure 380 may also, for example, contact a portion of the top surface of the encapsulating layer 370 in a region around the periphery of the conductive post 350.

The example interconnection structure 380 has a vertical height (or upper end to lower end distance) that is equal to or greater than a vertical height (or upper end to lower end distance) of the conductive post 350. In another implementation, the interconnection structure 380 may be shorter than the conductive post 350.

A portion of the interconnection structure 380 (e.g., around the upper end portion of the lateral side surface of the conductive post 350) is positioned directly vertically between the conductive post 350 (e.g., an upper portion thereof) and the semiconductor die 110. For example, a portion of the interconnection structure 380 undercuts the top end surface of the conductive post 350.

In general, block 5090 may comprise forming an interconnection structure. Accordingly, the scope of this disclosure should not be limited by characteristics of any particular type of interconnection structure or by any particular manner of forming an interconnection structure.

The example method 5000 may, for example at block 5095, comprise performing continued processing. Such continued processing may comprise performing any of a variety of continued processing operations. For example, block 5095 may comprise performing further encapsulating operations, forming signal distribution structures, coupling the electronic device to other electronic devices, packaging, shipping, marking, etc. In an example scenario in which the process steps discussed herein are performed at the wafer or panel level, block 5095 may comprise singulating individual assemblies (or package, sub-assemblies, etc.) from the wafer or panel. Block 5095 may also, for example, comprise directing execution flow of the example method 5000 to any other block (or sub-block) of the example method 5000 or any other method block (or sub-block) discussed herein.

In general, block 5095 may comprise performing continued processing. Accordingly, the scope of various aspects of this disclosure should not be limited by characteristics of any particular manner of performing continued processing.

The example electronic device 300 (a portion of which is shown at the example implementation 600E at FIG. 6E) may result from the example method 5000.

The discussion herein included numerous illustrative figures that showed various portions of a semiconductor (or electronic) package assembly and method of manufacturing thereof. For illustrative clarity, such figures did not show all aspects of each example assemblies. Any of the example assemblies and/or methods provided herein may share any or all characteristics with any or all other assemblies and/or methods provided herein. For example and without limitation, any of the example assemblies and/or methods shown and discussed with regard to FIGS. 1 and 2, or portions thereof, may be incorporated into any of the example assemblies and/or methods discussed with regard to FIGS. 3 and 4 or with regard to FIGS. 5 and 6. Similarly, any of the assemblies and/or methods shown and discussed with regard to FIGS. 3 and 4 may incorporated into the assemblies and/or methods shown and discussed with regard to FIGS. 1 and 2 or with regard to FIGS. 5 and 6. Similarly, any of the assemblies and/or methods shown and discussed with regard to FIGS. 5 and 6 may incorporated into the assemblies and/or methods shown and discussed with regard to FIGS. 1 and 2 or with regard to FIGS. 3 and 4.

In summary, various aspects of this disclosure provide an electronic device and a method of making an electronic device. As non-limiting examples, various aspects of this disclosure provide various methods of making electronic devices, and electronic devices made thereby, that utilize a film assist mold process. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A method of manufacturing an electronic device, the method comprising:
   providing a semiconductor die comprising a conductive pad, a die dielectric layer, and an aperture in the die dielectric layer through which the conductive pad is exposed;
   forming a conductive post on the semiconductor die and electrically connected to the conductive pad, where the conductive post comprises a bottom post end, a top post end surface opposite the bottom post end, and a side post surface between the bottom post end and the top post end surface;
   applying a film to the top post end surface and at least an upper end portion of the side post surface;
   after said applying a film, forming an encapsulating layer between the applied film and the semiconductor die;
   after said forming an encapsulating layer, removing the film; and
   forming a conductive interconnection structure on the top post end surface.

2. The method of claim 1, wherein said removing the film comprises mechanically removing the film.

3. The method of claim 1, wherein said forming a conductive post comprises plating metal.

4. The method of claim 1, comprising forming a copper conductive layer electrically connected to the conductive pad, and said forming a conductive post comprises plating copper on the conductive layer.

5. The method of claim 1, wherein the conductive post is laterally wider at the top post end surface than at the bottom post end.

6. The method of claim 1, wherein said applying a film comprises applying pressure to the film with a mold chase.

7. The method of claim 1, wherein said forming an encapsulating layer comprises injecting encapsulating material between the applied film and the semiconductor die.

8. The method of claim 1, wherein said forming a conductive interconnection structure comprises forming the conductive interconnection structure to directly contact the top post end surface and the upper end portion of the side post surface.

9. The method of claim 8, wherein a portion of the conductive interconnection structure is positioned directly vertically between the upper end portion of the side post surface and the semiconductor die.

10. The method of claim 1, wherein the conductive interconnection structure comprises a solder structure.

11. The method of claim 1, comprising:
forming a first dielectric layer on the die dielectric layer and on the conductive pad, the first dielectric layer comprising a first aperture through which the conductive pad is exposed; and
forming a conductive layer on the first dielectric layer and in the first aperture,
wherein said forming a conductive post comprises forming the conductive post on the conductive layer at a location laterally displaced from the conductive pad.

12. The method of claim 11, comprising forming a second dielectric layer on the first dielectric layer and on the conductive layer, the second dielectric layer comprising a second aperture through which the conductive layer is exposed and in which the conductive post is formed.

13. A method of manufacturing an electronic device, the method comprising:
providing a semiconductor die comprising a conductive pad, a die dielectric layer, and an aperture in the die dielectric layer through which the conductive pad is exposed;
forming a conductive post on the semiconductor die and electrically connected to the conductive pad, where the conductive post comprises a bottom post end, a top post end surface opposite the bottom post end, and a side post surface between the bottom post end and the top post end surface;
applying a film to the top post end surface and at least an upper end portion of the side post surface; and
after said applying a film, forming an encapsulating layer between the applied film and the semiconductor die.

14. The method of claim 13, wherein the conductive post is wider at the top post end surface than at the bottom post end.

15. The method of claim 13, wherein said applying a film comprises applying pressure to the film with a mold.

16. The method of claim 13, comprising after said forming an encapsulating layer, forming a solder structure on the top post end surface and on the upper end portion of the side post surface.

17. A method of manufacturing an electronic device, the method comprising:
providing a semiconductor die comprising a conductive pad, a die dielectric layer, and an aperture in the die dielectric layer through which the conductive pad is exposed;
forming a conductive post on the semiconductor die and electrically connected to the conductive pad, where the conductive post comprises a bottom post end, a top post end surface opposite the bottom post end, and a side post surface between the bottom post end and the top post end surface;
applying a film to the top post end surface;
after said applying a film, forming an encapsulating layer between the applied film and the semiconductor die;
after said forming an encapsulating layer, removing the film; and
forming a conductive interconnection structure on the top post end surface.

18. The method of claim 17, wherein said forming an encapsulating layer comprises forming the encapsulating layer to have a top surface that is below the top post end surface.

19. The method of claim 17, wherein a portion of the conductive interconnection structure is directly vertically between the conductive post and the semiconductor die.

20. The method of claim 17, wherein the conductive interconnection structure directly contacts the top post end surface and a top surface of the encapsulating layer.

* * * * *